US012650475B2

(12) United States Patent
Cheng et al.

(10) Patent No.: US 12,650,475 B2
(45) Date of Patent: Jun. 9, 2026

(54) TEST SYSTEM AND TEST METHOD THEREFOR

(71) Applicant: Contemporary Amperex Technology (Hong Kong) Limited, Hong Kong (CN)

(72) Inventors: Jiawu Cheng, Ningde (CN); Xueqing Gong, Ningde (CN); Guangwei Zhou, Ningde (CN); Kai Zhou, Ningde (CN); Haijie Wang, Ningde (CN)

(73) Assignee: Contemporary Amperex Technology (Hong Kong) Limited, Hong Kong (CN)

( * ) Notice: Subject to any disclaimer, the term of this patent is extended or adjusted under 35 U.S.C. 154(b) by 170 days.

(21) Appl. No.: 18/521,800

(22) Filed: Nov. 28, 2023

(65) Prior Publication Data

US 2024/0426937 A1     Dec. 26, 2024

Related U.S. Application Data

(63) Continuation of application No. PCT/CN2023/101919, filed on Jun. 21, 2023.

(51) Int. Cl.
*G01R 31/396*     (2019.01)
*G01R 31/3835*     (2019.01)
(Continued)

(52) U.S. Cl.
CPC ....... *G01R 31/396* (2019.01); *G01R 31/3835* (2019.01); *G01R 31/389* (2019.01); *H04N 7/183* (2013.01); *H04N 23/56* (2023.01)

(58) Field of Classification Search
None
See application file for complete search history.

(56) References Cited

U.S. PATENT DOCUMENTS 5,640,100 A * 6/1997 Yamagata .......... G01R 1/06705
                                    324/750.22
6,144,185 A * 11/2000 Dougherty ........... G01R 31/386
                                    320/132
(Continued)

FOREIGN PATENT DOCUMENTS

CN         202600413 U      12/2012
CN         106772082 A      5/2017
(Continued)

OTHER PUBLICATIONS

The European Patent Office (EPO) The Extended European Search Report for Application No. 23837536.4, Aug. 29, 2024 9 Pages.
(Continued)

*Primary Examiner* — Jas A Sanghera
(74) *Attorney, Agent, or Firm* — ANOVA LAW GROUP, PLLC

(57)     ABSTRACT

A test system comprises a test circuit board, a test device, a lower computer, and an upper computer. The test circuit board includes a test circuit, the test circuit comprising multiple main lines arranged side by side, one end of each of the main lines being used to connect with a positive electrode or a negative electrode of each battery cell of the battery module, and the other end of each of the main lines being connected with a first branch and a second branch. The lower computer controls a first branch connected to one of the main lines to be electrically conductive to a positive electrode of the test device and a second branch connected to another one of the main lines to be electrically conductive to a negative electrode of the test device. The upper computer controls the lower computer and reads parameter information for the test device.

19 Claims, 9 Drawing Sheets

(51) Int. Cl.
| | |
|---|---|
| *G01R 31/389* | (2019.01) |
| *H04N 7/18* | (2006.01) |
| *H04N 23/56* | (2023.01) |

(56) References Cited

U.S. PATENT DOCUMENTS

| | | | | |
|---|---|---|---|---|
| 6,249,125 | B1 * | 6/2001 | Haddad | H02J 7/0013 |
| | | | | 324/426 |
| 12,276,701 | B1 * | 4/2025 | Peter | G01R 31/388 |
| 2004/0251907 | A1 * | 12/2004 | Kalley | G01R 31/36 |
| | | | | 324/426 |
| 2009/0295396 | A1 | 12/2009 | Kouchi et al. | |
| 2010/0073003 | A1 * | 3/2010 | Sakurai | H02J 5/00 |
| | | | | 324/426 |
| 2014/0346894 | A1 * | 11/2014 | Csicsay | H01M 10/48 |
| | | | | 307/116 |
| 2015/0185289 | A1 | 7/2015 | Yang et al. | |
| 2016/0259015 | A1 * | 9/2016 | Carlo | B60L 50/60 |
| 2017/0234917 | A1 * | 8/2017 | Weber | G01R 27/14 |
| | | | | 324/691 |
| 2018/0088180 | A1 * | 3/2018 | Kamata | H02J 7/0013 |
| 2019/0213750 | A1 * | 7/2019 | Killelea | G06T 7/269 |
| 2021/0249702 | A1 * | 8/2021 | Murphy | G01R 31/3865 |
| 2024/0361363 | A1 * | 10/2024 | Vovos | G01R 31/006 |

FOREIGN PATENT DOCUMENTS

| | | | |
|---|---|---|---|
| CN | 207752125 | U | 8/2018 |
| CN | 210294485 | U | 4/2020 |
| CN | 111751689 | A | 10/2020 |
| CN | 111781515 | A | 10/2020 |
| CN | 111983491 | A | 11/2020 |
| CN | 112230166 | A | 1/2021 |
| CN | 115575793 | A | 1/2023 |
| CN | 218445627 | U | 2/2023 |
| CN | 219016435 | U | 5/2023 |
| JP | 2014027775 | A | 2/2014 |
| JP | 2018066588 | A | 4/2018 |
| WO | 2012014289 | A1 | 2/2012 |
| WO | 2022191363 | A1 | 9/2022 |

OTHER PUBLICATIONS

The World Intellectual Property Organization (WIPO) International Search Report and Written Opinion for PCT/CN2023/101919 Dec. 14, 2023 19 Pages (including translation).
State Intellectual Property Office of China Notice of Grant of Invention Patent Right for Application No. 202380061180.1 Jan. 7, 2026 5 pages (including translation).

* cited by examiner

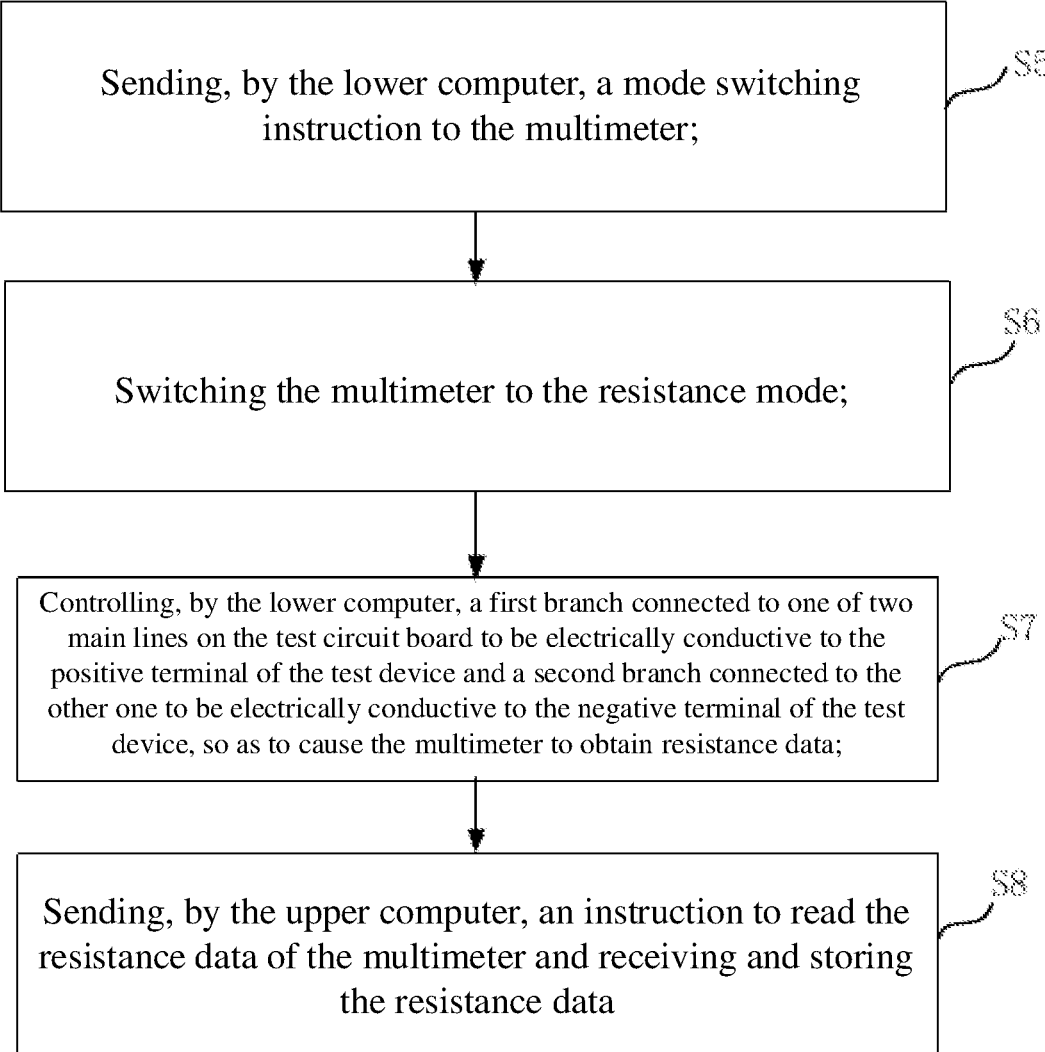

Sending, by the lower computer, a mode switching instruction to the multimeter;    S5

Switching the multimeter to the resistance mode;    S6

Controlling, by the lower computer, a first branch connected to one of two main lines on the test circuit board to be electrically conductive to the positive terminal of the test device and a second branch connected to the other one to be electrically conductive to the negative terminal of the test device, so as to cause the multimeter to obtain resistance data;    S7

Sending, by the upper computer, an instruction to read the resistance data of the multimeter and receiving and storing the resistance data    S8

FIG. 5

TEST SYSTEM AND TEST METHOD THEREFOR

CROSS-REFERENCE TO RELATED APPLICATION

This application is a continuation of International Application No. PCT/CN2023/101919, filed on Jun. 21, 2023, the entire content of which is incorporated herein by reference.

TECHNICAL FIELD

The present application relates to the technical field of battery module testing, and in particular relates to a test system and a test method therefor.

BACKGROUND

The battery module in the automotive power battery system is a module composed of battery cells connected in series and parallel, and the sampling wire harness of the module is used to collect the voltage of each battery cell of the module, the total open-circuit voltage after series and parallel connection, and the temperature at the temperature monitoring point, and to output them through a standard plug connector. If the sampling wire harness of the module experiences poor contact or circuit breaking, it can result in the loss of voltage and temperature points and cause the car to be unable to drive on the road or to experience driving faults. Therefore, the module wire harness on-off test is very important in the production process of battery modules.

Currently, the module wire harness on-off test methods mainly use test devices to test the voltage of the battery cell, and the test process requires frequent wiring, resulting in slow and inefficient testing.

SUMMARY OF THE INVENTION

The primary objective of the present application is to provide a test system that is intended to improve testing efficiency and testing precision.

In order to realize the above objective, the test system proposed in the present application comprises:

a test circuit board provided with a test circuit, the test circuit comprising multiple main lines arranged in a side by side manner, one end of each of the main lines being used to connect with a positive electrode or a negative electrode of each battery cell of the battery module, and the other end of each of the main lines being connected with a first branch and a second branch, wherein each said first branch is provided with one control switch, and each said second branch is provided with one said control switch;

a test device for testing parameter information for the multiple battery cells of the battery module;

a lower computer electrically connected to the control switch to control a first branch connected to one of the main lines to be electrically conductive to a positive electrode of the test device and a second branch connected to another one of the main lines to be electrically conductive to a negative electrode of the test device; and an upper computer communicatively connected to both the test device and the lower computer to control the operation of the lower computer and read parameter information for the test device.

One end of each main line in the above test system is connected to the positive electrode of each battery cell of the battery module, and the other end is connected to the test device through a branch line. The upper computer sends a test instruction to the lower computer, and the lower computer can control the control switch that needs to be conducted, so that the first branch for one of the main lines is electrically conductive to the positive electrode of the test device, and the second branch for another main line is electrically conductive to the negative electrode of the test device, so as to enable the test device to detect the parameter information for the battery cells in the battery module. The above two main lines may be selected to be two adjacent ones, or the corresponding two main lines may also be selected according to the definition of the connector pins on the wire harness board of the battery module. Then, according to the test instruction, the first branch for one of another two main lines is controlled to be electrically conductive to the positive electrode of the test device, and the second branch for the other one to be electrically conductive to the negative electrode of the test device, so as to detect the parameter information for other battery cells, for example, the voltage or the resistance, etc., and so on, so that the detection of parameter information for multiple battery cells in the battery module can be realized, without the need for repeated plugging and unplugging of the lines between the test device and the battery module. The upper computer in this test system can acquire the detection data of the test device and process and analyze it, and then can obtain the wire harness on-off condition.

Therefore, the test system in the present application can realize the sequential detection of multiple battery cells in a battery module without the need for repeated plugging and unplugging of wires by manual labor, which improves the detection efficiency and enhances the detection precision.

In an embodiment of the present application, ends of the multiple first branches far from the main lines are connected to form a first connecting end and ends of the multiple second branches far from the main lines are connected to form a second connecting end, with one of the first connecting end and the second connecting end being electrically connected to the positive electrode of the test device and the other one being electrically connected to the negative electrode of the test device.

Herein, the provision of the first connecting end and the second connecting end can make the multiple first branches and the multiple second branches need not to be repeatedly plugged and unplugged with the test device, thus further reducing the operation process and improves the detection efficiency, and protects the line, thereby reducing the chance of damage.

In an embodiment of the present application, the first connecting end is provided in a number of at least two, the at least two first connecting ends being provided in parallel; and/or the second connecting end is provided in a number of at least two, the at least two second connecting ends being provided in parallel.

Herein, by the provision of at least two first connecting ends and at least two second connecting ends, it is possible to utilize the others as alternatives in the event that one of them is faulty, thereby enhancing the usability of the test circuit.

In an embodiment of the present application, the test circuit further comprises multiple fuses, each of the fuses being provided on one of the main lines.

By configuring a fuse on each of the main lines, it is possible to effectively prevent damage to the device due to short-circuiting of the battery module caused by damage to the plug connector of the battery module or the plug connected in between.

In an embodiment of the present application, the test device is a multimeter, the multimeter comprising a voltage mode and a resistance mode, and the multimeter being electrically connected to the upper computer or the lower computer to switch between the voltage mode and the resistance mode.

Herein, the test device is optionally a multimeter, which may have multiple operation modes and multiple ranges, and when the upper computer or the lower computer controls the multimeter to switch to the resistance mode, it is also possible to realize the detection of thermistors at the multiple battery cells, and then obtain the temperature values corresponding to the resistance. The use of the multimeter can further improve the detection efficiency and simplify the structure.

In an embodiment of the present application, the test system further comprises a change-over test wire harness, and one end of each of the multiple main lines is connected with an aviation plug, two ends of the change-over test wire harness being plugged into the aviation plug and a plug-in end of the battery module, respectively.

Herein, by the provision of the change-over test wire harness and the aviation plug, it is only necessary to connect the change-over test wire harness to the plug connector of the battery module during the test without the need for repeated plugging and unplugging of the interfaces of the main lines of the test circuit, thereby reducing the wear and tear speed of the test circuit board and the aviation plug, so as to achieve the purposes of easy maintenance and cost reduction.

In an embodiment of the present application, the test system further comprises a reading mechanism, the reading mechanism being electrically connected to the upper computer, the reading mechanism being used to read bar code information for the battery module and send it to the upper computer, and the upper computer invoking a test scheme according to the bar code information.

Here, the reading mechanism, after acquiring the bar code information for the battery module, can cause the upper computer to acquire a corresponding detection formula for the battery module, thereby enhancing the applicability and the detection precision.

In an embodiment of the present application, the test system further comprises a test frame body, the test frame body comprising multiple transverse beams and multiple vertical beams that are connected longitudinally and transversely, wherein a test channel is formed through enclosure by the multiple transverse beams and the vertical beams, the test channel being for the battery module to pass through, and the reading mechanism is provided in the test channel.

The test frame body can provide a detection environment for the battery module to prevent external interference, thus effectively improving the protective properties, and can facilitate the assembly and fixing of various components, for example, the reading mechanism.

In an embodiment of the present application, the test system further comprises an image collection apparatus, the image collection apparatus being provided at one of the transverse beams and electrically connected to the upper computer to take a photograph of a battery module in the test channel for sampling and send it to the upper computer.

The image collection apparatus can collect the overall condition of the battery module and the connection condition of the battery cells and store same, so as to provide a retrospective basis for subsequent performance analysis.

In an embodiment of the present application, the test system further comprises a light source, the light source being provided at another one of the transverse beams and located at one side of the image collection apparatus;

and/or the test system further comprises a safety light curtain, the safety light curtain being provided between two vertical beams oppositely arranged, and being electrically connected to the upper computer to block the test channel.

The provision of the light source can perform light replenishment for the battery module to be detected, thereby enhancing the effect of image collection.

The provision of the safety light curtain can further enhance the protective properties.

In an embodiment of the present application, the test system further comprises an integrated cabinet, the integrated cabinet being formed with an accommodating cavity and located at one side of the test frame body, the test circuit board, the test device, and the lower computer being all provided in the accommodating cavity, and the aviation plug being at least partially exposed in the integrated cabinet.

Here, the integration of the various components in an integrated cabinet can effectively save the footprint and thus increase the flexibility of setting up the device. Moreover, the integrated cabinet is placed on the outer side of the test frame body and is on the outside of the production line, thereby improving the maintainability of the device.

In an embodiment of the present application, the test system further comprises a warning member, the warning member being mounted to the test frame body and/or the integrated cabinet and electrically connected to the upper computer to reflect the operational status of the test system.

The warning member can display the operational status of the test system, for example, normal operation, malfunction, or standby, which enables advance prediction to avoid reworking, thereby improving the detection efficiency.

In an embodiment of the present application, the test system further comprises a human-computer interaction apparatus, the human-computer interaction apparatus being mounted to the test frame body and electrically connected to the upper computer to display detection information or to debug the test system.

The human-computer interaction apparatus can enable the operator to monitor the detection data of the test system and to be able to adjust the operating parameters of the test system at any time, thereby ensuring the test performance of the test system.

In an embodiment of the present application, there is a mounting bracket rotatably connected to one of the vertical beams, and the human-computer interaction apparatus is mounted to the mounting bracket so as to be rotatably provided on a horizontal plane relative to the test frame body.

The vertical beam being rotatably connected to the mounting bracket can enable it to be rotatably disposed in a horizontal plane, so that the orientation of the human-computer interaction apparatus can be adjusted, thereby further facilitating the viewing and operation of the operator.

In an embodiment of the present application, the test system further comprises an accommodating member, the accommodating member being provided on one of the transverse beams or vertical beams to accommodate the change-over test wire harness.

The provision of the accommodating member can facilitate the accommodation of the change-over test wire harness, which makes the test system tidier and prevents the damage of the change-over test wire harness.

In an embodiment of the present application, the test system further comprises a start-up member, the start-up member being provided at a circumferential side of the test frame body and the start-up member being provided with two start-up portions, with the two start-up portions being electrically connected to the upper computer to start the test system;

and/or the test system further comprising a card reader, the card reader being mounted on the test frame body and electrically connected to the upper computer.

The start-up member is used to start up the test system, and the simultaneous control of the two start-up portions by both hands can enable both hands of the operator to be located outside the test channel, thus avoiding interference with the test, so as to improve the protective properties.

On the basis of the structure with or without a start-up member, the provision of a card reader raises the security level of this test system, making it possible to debug and control the test system only after a card has been swiped to confirm the identity.

The present application further proposes a test method for a test system, wherein the test system comprises a test circuit board, a test device, an upper computer, and a lower computer, the test method comprising the steps of:

sending, by the upper computer, a test instruction to the lower computer;

receiving, by the lower computer, the test instruction and controlling a first branch connected to one of two said main lines on the test circuit board to be electrically conductive to a positive electrode of a test device and a second branch connected to the other one to be electrically conductive to a negative electrode of the test device; detecting, by the test device, parameter information for the battery cell; and sending, by the upper computer, an instruction to read parameter information for the test device and receiving and storing the parameter information.

This method is that the upper computer sends a test instruction to the lower computer, and the lower computer can control the control switch that needs to be conducted, so that the first branch of one of the main lines is electrically conductive to the positive electrode of the test device, and the second branch of another main line is electrically conductive to the negative electrode of the test device, so as to enable the test device to detect the parameter information for the battery cells in the battery module. The above two main lines may be selected to be two adjacent ones, or the corresponding two main lines may also be selected according to the connector pins on the wire harness board of the battery module. By analogy, the sequential detection of parameter information for multiple battery cells can be realized. The method for the test system in the present application can realize the sequential detection of parameters of multiple battery cells in a battery module without the need for repeated plugging and unplugging of wires by manual labor, which improves the detection efficiency and enhances the detection precision.

In an embodiment of the present application, the test device comprises a multimeter, the multimeter having a voltage mode and a resistance mode and being electrically connected to the lower computer, and the parameter information is voltage data; and after the step of sending, by the upper computer, an instruction to read parameter information for the test device and receiving and storing the parameter information, the test method comprises:

sending, by the lower computer, a mode switching instruction to the multimeter;

switching the multimeter to the resistance mode;

controlling, by the lower computer, a first branch connected to one of two main lines on the test circuit board to be electrically conductive to the positive electrode of the test device and a second branch connected to the other one to be electrically conductive to the negative electrode of the test device, so as to cause the multimeter to obtain resistance data; and sending, by the upper computer, an instruction to read the resistance data of the multimeter and receiving and storing the resistance data.

The test method, through the use of a multimeter, can test one by one the voltages and the NTC resistance and other values of single battery cells within the battery module, or the voltages of the connector pins that need to be tested, etc., and then, according to the results of the detection, can determine whether the sampling wire harness within the battery module is on or off. In this method, the detection of two values can be realized by a multimeter without the need for repeated plugging and unplugging of the wire harness, which can further enhance the detection efficiency and protect the wire harness and the plug connector, thus improving the usability.

In an embodiment of the present application, after the step of sending, by the upper computer, an instruction to read the resistance data of the multimeter and receiving and storing the resistance data, the test method further comprises:

uploading, by the upper computer, detection data to a general execution platform if it determines that a sampling wire harness of a battery module is qualified according to the voltage data and the resistance data;

or marking and uploading, by the upper computer, detection data to a general execution platform if it determines that a sampling wire harness of a battery module is unqualified according to the voltage data and the resistance data.

In this method, through the processing by the upper computer, the detection of the wire harness of the battery module can be realized, so as to quickly find the defects of the battery module to avoid reworking, and at the same time, the differentiation of different test results can be realized, so as to provide traceable data for the subsequent processing.

In an embodiment of the present application, the test system further comprises a test frame body and a reading mechanism, the test frame body being formed with a test channel; and before the step of sending, by the upper computer, a test instruction to the lower computer, the test method further comprises the steps of:

sending, by the upper computer after detecting the entry of a battery module into the test channel, an instruction to read a bar code of the battery module to the reading mechanism;

reading, by the reading mechanism, the bar code of the battery module, and sending bar code information to the upper computer; and invoking, by the upper computer, a corresponding detection formula according to the bar code information, and triggering a detection mechanism.

By the provision of the reading mechanism, more targeted detection can be carried out according to different types of battery modules, thus improving the detection efficiency.

In an embodiment of the present application, the detection system further comprises an image collection apparatus, and before the step of sending, by the upper computer after detecting the entry of a battery module into the test channel, an instruction to read a bar code of the battery module to the reading mechanism, the test method further comprises:

sending, by the upper computer, an image collection instruction to the image collection apparatus;

collecting, by the image collection apparatus, image data of the battery module, and sending it to the upper computer; and receiving and storing the image data by the upper computer.

Here, the image collection apparatus can collect the overall condition of the battery module and the connection condition of the battery cells and store same, so as to provide a retrospective basis for subsequent performance analysis.

The present application further proposes a test method for a test system, wherein the test system comprises a test circuit board, a test device, an upper computer, and a lower computer, the test method comprising the steps of:

sending a first test instruction to the lower computer to cause the lower computer to control a first branch connected to one of two main lines on the test circuit board to be electrically conductive to a positive electrode of the test device and a second branch connected to the other one to be electrically conductive to a negative electrode of the test device, so that the test device detects parameter information for the battery cell; and sending an instruction to read parameter information for the test device and receiving and storing the parameter information.

This method is that the upper computer sends a test instruction to the lower computer, and the lower computer can control the control switch that needs to be conducted, so that the first branch of one of the main lines is electrically conductive to the positive electrode of the test device, and the second branch of another main line is electrically conductive to the negative electrode of the test device, so as to enable the test device to detect the parameter information for the battery cells in the battery module. The above two main lines may be selected to be two adjacent ones, or the corresponding two main lines may also be selected according to the connector pins on the wire harness board of the battery module. By analogy, the sequential detection of parameter information for multiple battery cells can be realized. The method for the test system in the present application can realize the sequential detection of parameters of multiple battery cells in a battery module without the need for repeated plugging and unplugging of wires by manual labor, which improves the detection efficiency and enhances the detection precision.

In an embodiment of the present application, the test device comprises a multimeter, the multimeter having a voltage mode and a resistance mode and being electrically connected to the lower computer, and the parameter information is voltage data; and after the step of sending an instruction to read parameter information for the test device and receiving and storing the parameter information, the test method further comprises:

sending a second test instruction to the lower computer to cause the lower computer to control the multimeter to switch to the resistance mode and obtain resistance data; and sending an instruction to read the resistance data of the multimeter and receiving and storing the resistance data.

The test method, through the use of a multimeter, can test one by one the voltages and the NTC resistance and other values of single battery cells within the battery module, or the voltages of the connector pins that need to be tested, etc., and then, according to the results of the detection, can determine whether the sampling wire harness within the battery module is on or off. In this method, the detection of two values can be realized by a multimeter without the need for repeated plugging and unplugging of the wire harness, which can further enhance the detection efficiency and protect the wire harness and the plug connector, thus improving the usability.

In an embodiment of the present application, after the step of sending an instruction to read the resistance data of the multimeter and receiving and storing the resistance data, the test method further comprises:

uploading detection data to a general execution platform if it is determined that a sampling wire harness of a battery module is qualified according to the voltage data and the resistance data;

or marking and uploading detection data to a general execution platform if it is determined that a sampling wire harness of a battery module is unqualified according to the voltage data and the resistance data.

In this method, through the processing by the upper computer, the detection of the wire harness of the battery module can be realized, so as to quickly find the defects of the battery module to avoid reworking, and at the same time, the differentiation of different test results can be realized, so as to provide traceable data for the subsequent processing.

In an embodiment of the present application, the test system further comprises a test frame body and a reading mechanism, the test frame body being formed with a test channel, and before the step of sending a first test instruction to the lower computer, the test method further comprises the steps of:

detecting the entry of a battery module into the test channel;

sending an instruction to read a bar code of the battery module to the reading mechanism, so as to read the bar code of the battery module; and acquiring the bar code information, and invoking a corresponding detection formula according to the bar code information, and triggering a detection mechanism.

By the provision of the reading mechanism, more targeted detection can be carried out according to different types of battery modules, thus improving the detection efficiency.

In an embodiment of the present application, the detection system further comprises an image collection apparatus, and after the step of detecting the entry of a battery module into the test channel and before the step of sending an instruction to read a bar code of the battery module to the reading mechanism, so as to read the bar code of the battery module, the test method further comprises:

sending an image collection instruction to the image collection apparatus; and acquiring and storing image data of the battery module that is collected by the image collection apparatus.

Here, the image collection apparatus can collect the overall condition of the battery module and the connection condition of the battery cells and store same, so as to provide a retrospective basis for subsequent performance analysis.

DESCRIPTION OF DRAWINGS

In order to more clearly illustrate the technical solutions in the embodiments of the present application or in the prior art, the accompanying drawings that need to be used in the description of the embodiments or the prior art will be briefly introduced below, and it is obvious that the accompanying drawings in the following description are only some embodiments of the present application, and for the person of ordinary skill in the field, other drawings can be obtained based on the structures illustrated in these accompanying drawings without any creative labor.

FIG. 5 is a flowchart of a second embodiment of a test method for a test system of the present application;

DESCRIPTION OF REFERENCE NUMERALS

Figure 1:
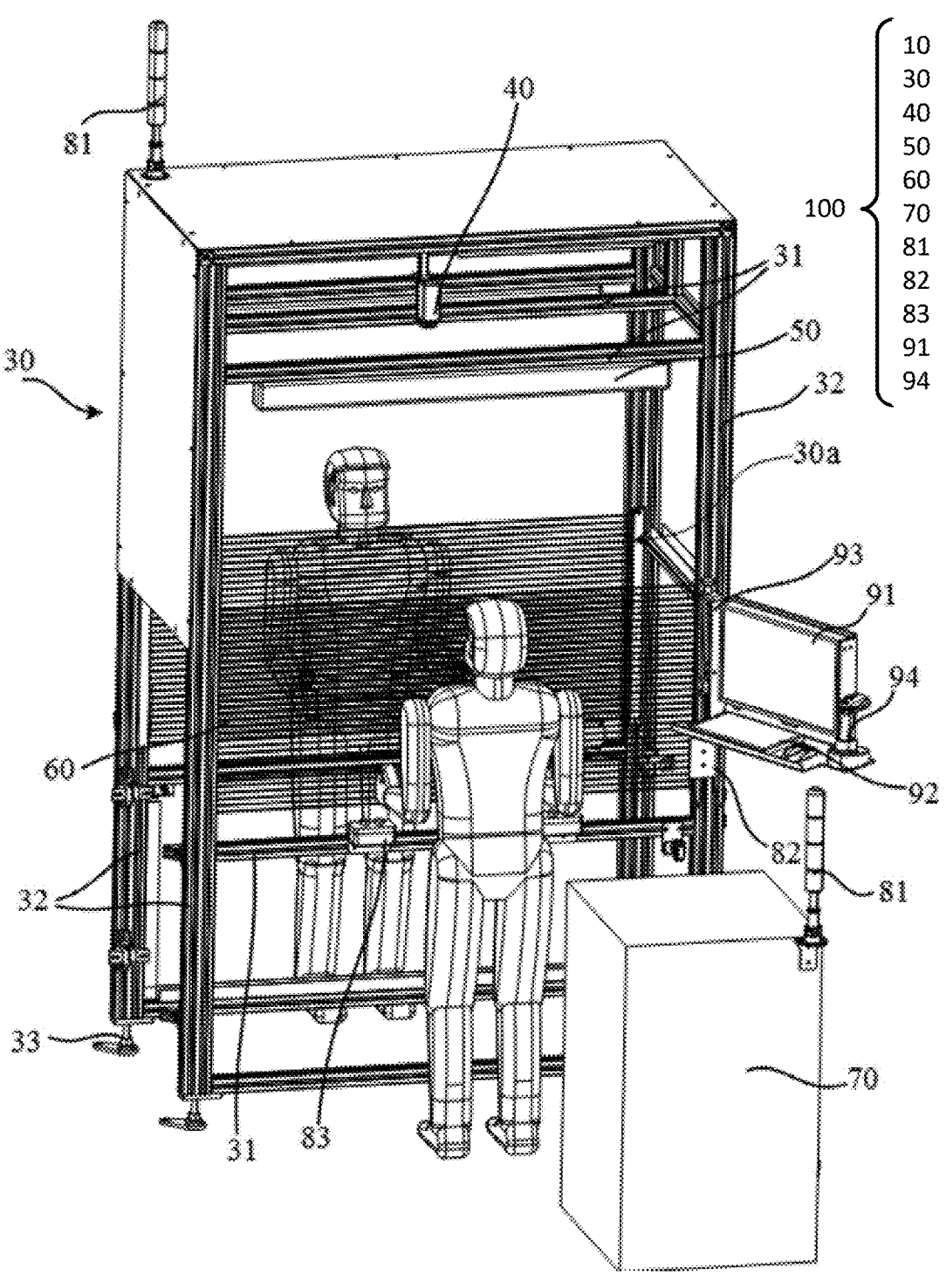
FIG. 1 is a structural schematic diagram of a test system of the present application.

| Numeral | Name | Numeral | Name |
|---|---|---|---|
| 100 | Test system | 31 | Transverse beam |
| 10 | Test circuit board | 32 | Vertical beam |
| 11 | Test circuit | 33 | Ground foot |
| 111 | Main line | 40 | Image collection apparatus |
| 112 | First connecting end | 50 | Light source |
| 113 | Branch line | 60 | Safety light curtain |
| 114 | Second connecting end | 70 | Integrated cabinet |
| 115 | Control switch | 81 | Warning member |
| 117 | Fuse | 82 | Accommodating member |
| 20 | Digital multimeter | 83 | Start-up member |
| 21 | Positive pen | 91 | Display |
| 22 | Negative pen | 92 | Input assembly |
| 30 | Test frame body | 93 | Mounting bracket |
| 30a | Test channel | 94 | Card reader |

The realization of the purpose, functional features and advantages of present application will be further described in conjunction with the embodiments with reference to the accompanying drawings.

DETAILED DESCRIPTION

The technical solutions in the embodiments of the present application will be described clearly and completely in the following in conjunction with the accompanying drawings in the embodiments of the present application, and it is apparent that the described embodiments are only a part of the embodiments of the present application rather than not all of the embodiments. Based on the embodiments according to the present application, all other embodiments obtained by those of ordinary skill in the art without creative effort fall within the protection scope of the present application.

It is to be noted that all directional indications (such as up, down, left, right, forward, back, . . . ) in the embodiments of the present application are only used to explain the relative positional relationship, the movement situation, etc., between the various components in a particular attitude (as shown in the accompanying drawings), and that the directional indications are correspondingly changed if the particular attitude is changed.

In the present application, the terms "connection", "fixing", etc. are to be understood in a broad sense, unless otherwise expressly specified and limited. For example, "fixing" may be a fixed connection, a detachable connection, or a one-piece connection; it may be a mechanical connection or an electrical connection; it may be a direct connection or an indirect connection through an intermediary medium; and it may be communication within two elements or interaction between two elements, unless otherwise expressly limited. For those of ordinary skill in the art, the specific meanings of the above terms in the present application can be understood according to specific situations.

Furthermore, the descriptions of "first", "second", etc., in the present application are for descriptive purposes only, and are not to be construed as indicating or implying their relative importance or implicitly specifying the number of technical features indicated. As a result, a feature defined by "first" or "second" may expressly or implicitly comprise at least one such feature. In addition, "and/or" appearing throughout the text means that it comprises three concurrent schemes, and taking "A and/or B" as an example, it comprises scheme A, or scheme B, or a scheme in which both A and B are satisfied. In addition, the technical solutions of the various embodiments may be combined with one another, but only on the basis that they can be realized by a person of ordinary skill in the art, and when the combination of the technical solutions appears to be contradictory or unattainable, it should be considered that such a combination of the technical solutions does not exist and is not included in the scope of protection claimed in the present application.

Batteries mentioned in this field can be categorized into disposable batteries and rechargeable batteries according to whether they are rechargeable or not. The common types of rechargeable batteries available today are: lead-acid batteries, nickel-metal hydride batteries, and lithium-ion batteries. Lithium-ion batteries are now widely used in pure electric vehicles and hybrid vehicles. Lithium-ion batteries used for this purpose have a relatively slightly lower capacity, but have a larger output, charging current, and a longer service life, but at a higher cost.

The battery described in the embodiments of the present application refers to a rechargeable battery. Hereinafter, the embodiments disclosed in the present application will be described primarily in terms of a lithium-ion battery as an example. It should be understood that the embodiments disclosed in the present application are applicable to any other suitable type of rechargeable battery. The battery referred to in the embodiments disclosed in the present application may be directly or indirectly applied in an appropriate apparatus to power the apparatus.

The battery referred to in the embodiments disclosed in the present application refers to a single physical module including one or more battery cells to provide a predetermined voltage and capacity. The battery cell is the basic unit in a battery, which comprises a positive electrode plate, a negative electrode plate, an electrolyte solution and a separator. The lithium-ion battery cell operates primarily relying on the movement of lithium ions between the positive electrode plate and the negative electrode plate. In general, according to the way of encapsulation, they can be categorized into: cylindrical battery cells, rectangular battery cells and pouch cells. Hereafter, the description will be mainly centered on the rectangular battery cell. It should be understood that the embodiments described below are also applicable in some aspects for a cylindrical battery cell or a pouch cell.

Many design factors, such as the energy density, cycle life, discharge capacity, charge-discharge rate and other performance parameters, should be considered in the development of the battery technology. In the battery production and manufacturing process, the battery often needs to go through many processes and stations to complete the production and measurement to produce a complete battery. First, the positive electrode plate, the negative electrode plate, the electrolyte solution and the separator are molded into the form of a battery cell, which is then subjected to processes such as shelling, welding, and chemical formation to form the battery cell.

The battery module in the automotive power battery system is a module composed of battery cells connected in series and parallel, and the sampling wire harness of the module is used to collect the voltage of each battery cell of the module, the total open-circuit voltage after series and parallel connection, and the temperature at the temperature monitoring point, and to output them through a standard plug connector. Poor contact or disconnection of the module wire harness due to poor soldering, poor terminal crimping, breakage by external pressure, and other causes lead to the loss of voltage and temperature points, which results in the car being unable to drive on the road or experiencing driving faults. Therefore, the module wire harness on-off test is very important in the production process of battery modules (battery packs).

In the related technology, the module wire harness on-off test method mainly adopts the manual wiring and handheld multimeter test approach, which requires frequent wiring and wire replacement for multiple battery cells, resulting in low test speed and low efficiency. Due to the influence of personnel factors, missing of tests is likely to occur, and the testing precision is low, making it impossible to accurately detect the quality problems of the connection between the sampling wire harness board and the battery module.

Therefore, in order to solve the problem of low testing efficiency in the related art, the present application improves the structure of the test system. By providing a test circuit board in the test system that can simultaneously test the voltages of multiple battery cells in the battery module, it is possible to target the multiple battery cells in the same module without the need for repeated plugging and unplugging of wires, so as to improve the detection efficiency and detection precision.

Figure 2:
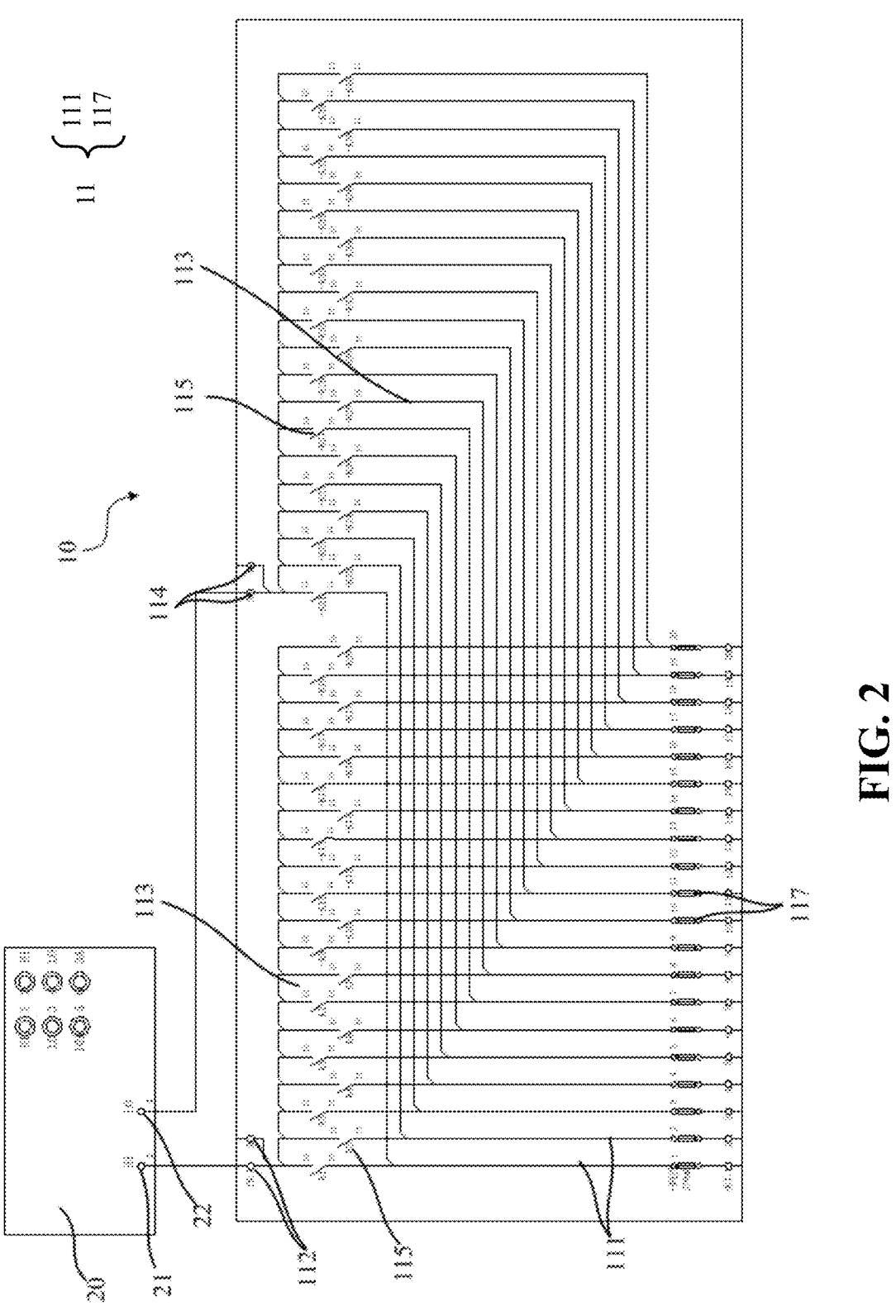
FIG. 2 is a structural schematic diagram of an embodiment of a test circuit board in the test system of the present application.
Figure 3:
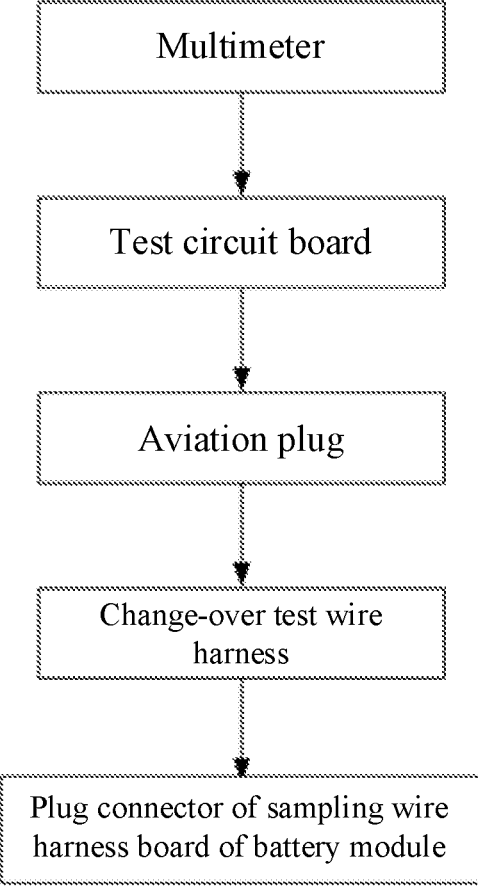
FIG. 3 is a structural schematic diagram of the connection between a multimeter and a battery module in the test system of the present application.

Referring to FIGS. 1 to 3, in an embodiment of the present application, the test system 100 includes a test circuit board 10, a test device, a lower computer, and an upper computer, wherein the test device is used for testing parameter information for the multiple battery cells of the battery module; the test circuit board 10 is provided with a test circuit 11, the test circuit 11 comprising multiple main lines 111 arranged in a side by side manner, one end of each of the main lines 111 being used to connect with a positive electrode or a negative electrode of each battery cell of the battery module, and the other end of each of the main lines 111 being connected with a first branch and a second branch, wherein each first branch is provided with one control switch 115, and each second branch is provided with one control switch 115;

the lower computer is electrically connected to the control switch 115 to control a first branch connected to one of two main lines 111 to be electrically conductive to a positive electrode of the test device and a second branch connected to the other one to be electrically conductive to a negative electrode of the test device; and the upper computer is communicatively connected to both the test device and the lower computer to control the operation of the lower computer and read parameter information for the test device.

Herein, the test circuit board 10 is a carrier for the test circuit 11, which has multiple main lines 111, and one end of each of the multiple main lines 111 may be disposed in a side by side manner on one side of the width of the board body of the test circuit board 10, so as to facilitate the connection of the wire harness of the battery module. The other end of the main line 111 is branched out into a first branch and a second branch, and multiple first branches and second branches are disposed on the other side of the width of the board body of the test circuit board 10, so that the multiple main lines 111 are disposed spaced apart in a side by side manner in the length direction of the board body, and the multiple first branches and second branches are also disposed spaced apart in a side by side manner in the length direction of the board body and can be provided as pin-type plug connectors, which further facilitates the butting of the wire harness. Each of the first branches and each of the second branches are separately provided with one control switch 115, and the opening and closing of the control switch 115 affects the on and off of the main line 111, thereby facilitating the detection of different battery cells.

The positive and negative electrodes of the test device are electrically connected to the positive and negative electrodes of the battery cell of the battery module through the test circuit board 10 in order to be used for detecting and displaying parameter information for the battery cell, wherein the parameter information may be, for example, voltage data or resistance data, and when it is voltage data, the type of the test device may be, for example, a multimeter, a voltmeter, or an oscilloscope, which is not limited herein.

The lower computer is a programmable logic controller (PLC). The test circuit 11 is electrically connected to the lower computer, wherein the two may be connected by a direct line connection or by a wireless communication connection, as long as they are capable of controlling the opening and closing of the control switch 115.

The upper computer is a carrier that carries the software that can send instructions to the lower computer and read and process various data. For example, as a total controller, it can send a test instruction to the lower computer and finally acquire the detection results, and analyze and process them to judge whether the wire harness is on or off.

One end of each main line 111 in the above test system 100 is connected to the positive electrode of each battery cell of the battery module, and the other end is connected to the test device through a branch line 113. The upper computer sends a test instruction to the lower computer, and the lower computer can control the control switch 115 that needs to be conducted, so that the first branch of one of the main lines 111 is electrically conductive to the positive electrode of the test device, and the second branch of another main line 111 is electrically conductive to the negative electrode of the test device, so as to enable the test device to detect the parameter information for the battery cells in the battery module. The above two main lines 111 may be selected to be two adjacent ones, or the corresponding two main lines 111 may also be selected according to the definition of the connector pins on the wire harness board of the battery module. Then, the first branch of one of another two main lines 111 is controlled to be electrically conductive to the positive electrode of the test device, and the second branch of the other one to be electrically conductive to the negative electrode of the test device, so as to detect the parameter information for another battery cell, and so on, so that the detection of the voltages of multiple battery cells in the battery module can be realized, without the need for repeated plugging and unplugging of the lines between the test device and the battery module. The upper computer in the test system 100 can acquire the parameter information for the battery cell that is detected by the test device, and process and analyze it, and then can obtain the condition of on-off of the wire harness.

Therefore, the test system 100 in the present application can realize the sequential detection of multiple battery cells in a battery module without the need for repeated plugging and unplugging of wires by manual labor, which improves the detection efficiency and enhances the detection precision.

With continued reference to FIG. 2, in an embodiment of the present application, ends of the multiple first branches far from the main lines 111 are connected to form a first connecting end 112 and ends of the multiple second branches far from the main lines 111 are connected to form a second connecting end 114, with one of the first connecting end 112 and the second connecting end 114 being electrically connected to the positive electrode of the test device and the other one being electrically connected to the negative electrode of the test device.

Here, the other end of each main line 111 branches out into a first branch and a second branch, wherein the first branch is provided to extend in the extension direction of the main line 111, and the second branch is provided to bend and then extend in the extension direction of the main line 111. In this way, the multiple first branches of the multiple main lines 111 are provided to be spaced apart in a side by side manner and eventually converge and connect to form the first connecting end 112, and the multiple second branches of the multiple main lines 111 are provided to be spaced apart in a side by side manner and eventually converge and connect to form the second connecting end 114, and to connect the first connecting end 112 directly to one of the positive and negative electrodes of the test device and the second connecting end 114 directly to the other of the positive and negative electrodes of the test device, it is only necessary for the lower computer to control the opening and closing of the control switch 115.

The provision of the first connecting end 112 and the second connecting end 114 can make the multiple first branches and the multiple second branches need not to be repeatedly plugged and unplugged with the test device, which further reduces the operation process and improves the detection efficiency, and protects the line, thus reducing the chance of damage.

With continued reference to FIG. 2, in an embodiment of the present application, the first connecting end 112 is provided in a number of at least two, the at least two first connecting ends 112 being provided in parallel;

and/or the second connecting end 114 is provided in a number of at least two, the at least two second connecting ends 114 are provided in parallel.

In order to enhance the usability of the test circuit board 10, at least two first connecting ends 112 may be provided, for example, two or three or more. Herein, two first connecting ends 112 are provided so that in the event of a failure at the connection between one of the first connecting ends 112 and the test device, testing can be realized by change-over through the other one of the first connecting ends 112, which effectively saves costs and can improve the usability of the test circuit board 10.

The same as described above, at least two second connecting ends 114 may be provided so that in the event of a failure of one of the second connecting ends 114, it may be possible to transfer to the other second connecting end 114, thereby further enhancing the usability of the test circuit board 10.

Referring again to FIG. 2, in an embodiment of the present application, the test circuit 11 further comprises multiple fuses 117, each of the fuses 117 being provided on one of the main lines 111.

Here, the fuse 117 being provided on the main line 111 means that the fuse 117 is connected in series to the main line 111 so that it can fuse itself in the event of a short circuit or a fault on that line, thus serving the purpose of protecting the device. In an example, the connection of the main line 111 to the fuse 117 may be achieved in a plugging and unplugging manner. For example, the fuse 117 has a fuse 117 receptacle and a portion of the line of the main line 111 is inserted into the fuse 117 receptacle to enable wiring. In other examples, a threaded connection may also be selected, which will not be repeated here.

By configuring a fuse 117 on each of the main lines 111, it is possible to effectively prevent damage to the device due to short-circuiting of the battery module caused by damage to the plug connector of the battery module or the plug connected in between, thereby enhancing the safety usability of the test circuit 11.

In an embodiment of the present application, the test device is a multimeter, the multimeter comprising a voltage mode and a resistance mode, and the multimeter being electrically connected to the upper computer or the lower computer to switch between the voltage mode and the resistance mode.

In an example, the multimeter may be a digital multimeter 20 with six-and-a-half or seven-and-a-half digits of accuracy, thereby having a high degree of precision, allowing for a significant increase in the detection precision to improve the timeliness of the on/off of the wire harness. Herein, the test device is optionally a multimeter, which can have multiple operation modes and multiple ranges, for example, voltage or resistance, etc., and when the upper computer or the lower computer controls the multimeter to switch to the resistance mode, it is also possible to realize the detection of thermistors at the multiple battery cells, and then obtain the temperature value corresponding to the resistance; or the resistance value of the battery cell.

The use of the multimeter can further improve the detection efficiency and simplify the structure.

In combination with FIG. 3, in an embodiment of the present application, the test system 100 further comprises a change-over test wire harness, and the multiple main lines 111 each have one end connected with an aviation plug, two ends of the change-over test wire harness being plugged into the aviation plug and a plug-in end of the battery module, respectively.

Herein, the change-over test wire harness is a section of wire that can be connected by plugging, which facilitates the plugging and unplugging connection, thus improving the efficiency and convenience. One end of the change-over test wire harness is electrically connected to the test circuit board 10 by means of an aviation plug, wherein the number of pins of the aviation plug and the number of aviation plugs can be set as needed so as to correspond to the number of the multiple main lines 111 and the number of battery cells of the battery module. For example, two sets of 64-pin aerial plugs may be selected. The setting of the aviation plugs can facilitate the replacement and connection of the change-over test wire harness. The length of the change-over test wire harness should not be too long, so as to save costs. In order to protect the change-over test wire harness, a wire harness channel can also be arranged, so that the change-over test wire harness can be connected to the plug connector of the battery module through the wire harness channel, thereby effectively reducing the chance of damage.

By the provision of the change-over test wire harness and the aviation plug, it is only necessary to connect the change-over test wire harness to the plug connector of the battery module during the test without the need for repeated plugging and unplugging of the interfaces of the main lines 111 of the test circuit 11, thereby reducing the wear and tear speed of the test circuit board and the aviation plug, so as to achieve the purposes of easy maintenance and cost reduction.

In an embodiment of the present application, the test system 100 further comprises a reading mechanism, the reading mechanism being electrically connected to the upper computer, the reading mechanism being used to read bar code information for the battery module and send it to the upper computer, and the upper computer invoking a test scheme according to the bar code information.

Here, the reading mechanism may be a radio frequency automatic identification apparatus or a bar code scanner, which is not limited herein. Because of the differences in the structure and type of the battery module, the reading mechanism is provided to read the bar code information for the battery module, so as to acquire the type or structure corresponding to the battery module, which facilitates the selection of the corresponding test scheme by the upper computer according to the acquired type or structure of the battery module, and enhances the applicability and the detection precision.

The test scheme is to first edit the test sequence, the multimeter measurement mode (voltage mode or resistance mode), and the serial number of the relay to be closed in the software of the upper computer in accordance with the test requirements of the battery cell (the requirements are generally battery cell voltage test, battery cell voltage difference, and NTC resistance test) as well as the definition of the connector pins.

With continued reference to FIG. 1, in an embodiment of the present application, the test system 100 further comprises a test frame body 30, the test frame body 30 comprising multiple transverse beams 31 and multiple vertical beams 32 that are connected longitudinally and transversely, wherein a test channel 30*a* is formed through enclosure by the multiple transverse beams 31 and the vertical beams 32, the test channel 30*a* being for the battery module to pass through, and the reading mechanism is provided in the test channel 30*a*.

The test frame body 30 may be of a frame body structure that comprises multiple transverse beams 31 and multiple vertical beams 32, and the transverse beams 31 and the vertical beams 32 may be made of a material such as profiles or wood, which facilitates processing and provides good structural stability. The connection of the transverse beams

31 and the vertical beams 32 may be a fixed connection, e.g., bonded or welded connection, etc., or a detachable connection, e.g., mortise and tenon connection, plug-in connection, or threaded connection, etc., which is not limited herein. In an example, this test frame body 30 comprises four vertical beams 32 and multiple transverse beams 31 connected between every two vertical beams 32 to form a square frame body structure. The test frame body 30 is formed with the test channel 30*a* in the lower middle portion thereof, so that it can be adapted to other production lines, and the battery module can be passed through the test channel 30*a* directly by the conveying structure to form a complete testing process of the battery module. In other examples, three or four or more vertical beams 32 may also be provided. The reading mechanism may be provided on one of the transverse beams 31 or on one of the vertical beams 32, which is not limited herein, as long as it corresponds to the bar code of the battery module.

The test frame body 30 can provide a detection environment for the battery module to prevent external interference, thus effectively improving the protective properties, and facilitate the assembly and fixing of various components, for example, the reading mechanism, to provide support and adapt to the production line, thus improving the overall detection efficiency of the battery module.

In an example, the test frame body 30 further comprises ground feet 33, wherein four ground feet 33 are separately mounted to the bottom ends of the vertical beams 32 so that a leveling operation can be carried out for the vertical beams 32 and the transverse beams 31 and the support stability can be improved at the same time. In another example, the test frame body 30 may further comprise a protective plate, wherein the protective plate is mounted at a connection between the top end of the vertical beam 32 and the transverse beam 31 located at the top, and may also be mounted on the side of the vertical beam 32, so that it can protect the test channel 30*a* against interference from the external environment.

With continued reference to FIG. 1, in an embodiment of the present application, the test system 100 further comprises an image collection apparatus 40, the image collection apparatus 40 being provided at one of the transverse beams 31 and electrically connected to the upper computer to take a photograph of a battery module in the test channel 30*a* for sampling and send it to the upper computer.

For example, the image collection apparatus 40 may be a line scan camera with high resolution and good imaging quality. In other examples, the image collection apparatus 40 may also be a 3d camera, an area camera, or a scanner, which is not limited herein. The image collection apparatus 40 is mounted on one of the transverse beams 31, wherein this transverse beam 31 is close to the top end of the vertical beam 32 and its projection on the horizontal plane is located at the central position or at one end of the test channel 30*a*, thereby making it possible to facilitate a comprehensive collection of the overall structure of the battery module.

The image collection apparatus 40 can collect the overall condition of the battery module and the connection condition of the battery cells and send same to the upper computer, and the upper computer stores same, so as to provide a retrospective basis for subsequent performance analysis.

Please refer to FIG. 1, in an embodiment of the present application, the test system 100 further comprises a light source 50, the light source 50 being provided at another one of the transverse beams 31 and located at one side of the image collection apparatus 40;

and/or the test system 100 further comprises a safety light curtain 60, the safety light curtain 60 being provided between two vertical beams 32 oppositely arranged, and being electrically connected to the upper computer to block the test channel 30*a*.

In an example, the light source 50 is a strip-shaped light source 50 with a wide range of light emission, which can provide better light replenishment effect for the image collection apparatus 40. In other examples, the light source 50 may also be of a dot matrix lamp bead structure. The light source 50 is provided on one side of the image collection apparatus 40 that is on the horizontal plane and emits light towards the battery module.

The provision of the light source 50 can perform light replenishment for the battery module to be detected, thereby enhancing the effect of image collection.

On the basis of having or not having the light source 50, in order to enhance the safety, a safety light curtain 60 is provided on the test frame body 30. The safety light curtain 60 is a photoelectric safety protection apparatus, and may comprise a transmitting end and a receiving end that are mounted on two vertical beams 32 provided opposite to each other, wherein the transmitting end transmits light, and when the receiving end receives the transmitted light, it is indicated that there is no obstacle influence; and when the receiving end does not receive the transmitted light, it is indicated that there is an obstacle reaching into the test channel 30*a*, which will influence the detection, so that a signal will be sent to the upper computer, and the upper computer may send a pause instruction to the lower computer, so as to cause the lower computer to control the test device to stop the detection.

The provision of the safety light curtain 60 can further enhance the protective properties and can improve the detection effect.

Referring again to FIG. 1, in an embodiment of the present application, the test system 100 further comprises an integrated cabinet 70, the integrated cabinet 70 being formed with an accommodating cavity and located at one side of the test frame body 30, the test circuit board 10, the test device, and the lower computer being all provided in the accommodating cavity, and the aviation plug being at least partially exposed in the integrated cabinet 70.

The integrated cabinet 70 may be configured in a square structure for easy placement on the floor to form a stable support structure. In other examples, the shape of the integrated cabinet 70 may also be cylindrical or other shapes. The material of the integrated cabinet 70 may be metal, e.g., stainless steel or aluminum alloy, etc., which is of high structural strength and therefore durable. The surface of the integrated cabinet 70 can be subjected to a de-staticizing treatment, thereby preventing influence on the components inside. Optionally, the integrated cabinet 70 comprises a cabinet body and a cabinet door, the cabinet body forming an accommodating cavity having an opening, and the cabinet door being movably connected to the cabinet body so that the opening of the accommodating cavity can be closed or opened to facilitate maintenance and installation by the operator. The test circuit board 10, the test device, and the lower computer are all located in the accommodating cavity so that they can be protected from interference, thereby improving the protective properties. Fixed mounting of the test device can also improve the detection precision, and in an example, a visual window can be provided in the cabinet body as needed so as to enable observation of the dials situation of the test device. The accommodating cavity may also be provided with other auxiliary assemblies, for example, a power source or a heat dissipation member, which is not limited herein. Where an aviation plug and a change-over test wire harness are provided, the aviation plug is partially exposed in the cabinet body to facilitate the plugging of the change-over test wire harness.

In an example, a wire harness sleeve may also be provided between the integrated cabinet 70 and the test frame body 30, the wire harness sleeve forming a wire harness channel through which the change-over test wire harness may pass, so as to be separately connected to the battery module and the aviation plug, which can enhance the protection for the change-over test wire harness and prolong its service life.

Here, the integration of the various components in an integrated cabinet 70 can effectively save the footprint and thus increase the flexibility of setting up the device. The integrated cabinet 70 can be provided standalone and placed on one side of the test frame body 30, i.e., on the outside of the production line, thereby improving the maintainability of the device.

Please refer to FIG. 1, in an embodiment of the present application, the test system 100 further comprises a warning member 81, the warning member 81 being mounted to the test frame body 30 and/or the integrated cabinet 70 and electrically connected to the upper computer to reflect the operational status of the test system 100.

Here, the warning member 81 may be a lamp or an alarm. For example, when the warning member 81 is a tricolor lamp, it may have four output statuses including three colors of light and a buzzer, wherein when the test system 100 is operating normally, a green light may be output; when the test system 100 is awaiting material, a yellow light may be output, and when the test system 100 is down or malfunctioning, a red light may be output and a buzzer may be emitted as a reminder.

The warning member 81 can reflect the operational status of the test system 100 in real time, so that timely handling and repairs can be carried out, thus avoiding rework testing of too many battery modules and improving the detection efficiency.

Referring again to FIG. 1, in an embodiment of the present application, the test system 100 further comprises a human-computer interaction apparatus, the human-computer interaction apparatus being mounted to the test frame body 30 and electrically connected to the upper computer to display detection information or to debug the test system 100.

In an example, the human-computer interaction apparatus comprises a display 91, a keyboard, and a mouse, etc., wherein the display 91 displays parameter information for the battery cell that is obtained from the testing by the test device, so as to be available for real-time monitoring by the operator. The keyboard and mouse can also facilitate debugging of the parameters of the test system 100 and presentation of data by the operator. In another example, the human-computer interaction apparatus may also be a touch-screen display.

The human-computer interaction apparatus can enable the operator to monitor the detection data of the test system 100 and to be able to adjust the operating parameters of the test system 100 at any time, thereby enhancing the test performance of the test system 100.

In an embodiment of the present application, there is a mounting bracket 93 rotatably connected to one of the vertical beams 32, and the human-computer interaction apparatus is mounted to the mounting bracket 93 so as to be rotatably provided on a horizontal plane relative to the test frame body 30.

In an example, one of one side of the mounting bracket 93 and the vertical beam 32 is provided with a pivot shaft, and the other is provided with a shaft hole, and rotation of the mounting bracket 93 with respect to the vertical beam 32 is realized by the cooperation of the pivot shaft and the shaft hole. In other examples, the rotational connection may also be realized by other components, e.g., a hinge, etc. In order to limit the angle of rotation of the mounting bracket 93, a locking member may be provided to lock the rotation of the mounting bracket 93 with the vertical beam 32 so as to limit them to a certain angle of rotation, and when an adjustment is required, it is only necessary to open the locking member. Alternatively, the rotation structure of the mounting bracket 93 is provided with a damping member so that the mounting bracket 93 can be rotated in a damped manner and thus can be position-limited in any position. In an optional example, the mounting bracket 93 comprises a support portion and a snap-in portion, wherein the support portion is used for placement of the keyboard and the mouse, and the snap-in portion is formed with a mounting slot in which the display assembly can be mounted.

The vertical beam 32 being rotatably connected to the mounting bracket 93 can enable the mounting bracket 93 to be rotatably disposed in a horizontal plane, so that the orientation of the human-computer interaction apparatus can be adjusted, thereby further facilitating the viewing and operation of the operator.

In an embodiment of the present application, the test system 100 further comprises an accommodating member 82, the accommodating member 82 being provided on one of the transverse beams 31 or vertical beams 32 to accommodate the change-over test wire harness.

In an example, the accommodating member 82 is of a hook structure which has a fixing portion and a curved hook connected to the fixing portion, wherein the fixing portion is used for detachable connection to the vertical beam 32 and the curved hook is used for hanging the change-over test wire harness. The number of curved hooks can be two to prevent excessive bending of the change-over test wire harness so as to prolong its service life. In other examples, the accommodating member 82 may also be of a box body structure and the like. After the testing is completed, the end of the change-over test wire harness that is connected to the battery module can be hung on the accommodating member 82 or placed inside the accommodating member 82. In other examples, the fixing portion may also be mounted on one of the transverse beams 31 and the height of this transverse beam 31 may be located in the lower middle portion of the vertical beam 32 to facilitate operation and accommodation.

The provision of the accommodating member 82 can facilitate the accommodation of the change-over test wire harness, which makes the test system 100 tidier and prevents the damage of the change-over test wire harness.

In an embodiment of the present application, the test system 100 further comprises a start-up member 83, the start-up member 83 being provided at a circumferential side of the test frame body 30 and the start-up member 83 being provided with two start-up portions, with the two start-up portions being electrically connected to the upper computer to start the test system 100;

and/or the test system 100 further comprising a card reader 94, the card reader 94 being mounted on the test frame body 30 and electrically connected to the upper computer.

The start-up member 83 is used to start up the test system 100, and can send a start-up instruction to the upper computer, which causes the upper computer to enter the test state. The start-up member 83 comprises two start-up portions, and the sending of the start-up instruction can be realized only if the two start-up portions are pressed at the same time, which in turn triggers the test state of the upper computer. In an example, the start-up member 83 is located at one of the transverse beams 31 and this transverse beam 31 is located near a lower middle portion of the vertical beam 32, at a height that can be touched by an adult with hands hanging down while standing, thus facilitating operation by the operator. The simultaneous control of the two start-up portions by both hands can enable both hands of the operator to be located outside the test channel 30a, thus avoiding interference with the test so as to improve the protective properties.

On the basis of the structure with or without the start-up member 83, a card reader 94 may be provided in the support portion or the mounting portion of the mounting bracket 93, wherein the card reader 94 may be available for the operator to swipe the card and be electrically connected to the upper computer, and after the operator swipes the card, the information on the card can be sent to the upper computer for identity confirmation, and if it matches, the upper computer sends an instruction that can be used for subsequent parameter adjustment and data display. The provision of the card reader 94 raises the security level of this test system 100, making it possible to debug and control the test system 100 only after a card has been swiped to confirm the identity.

Figure 4:
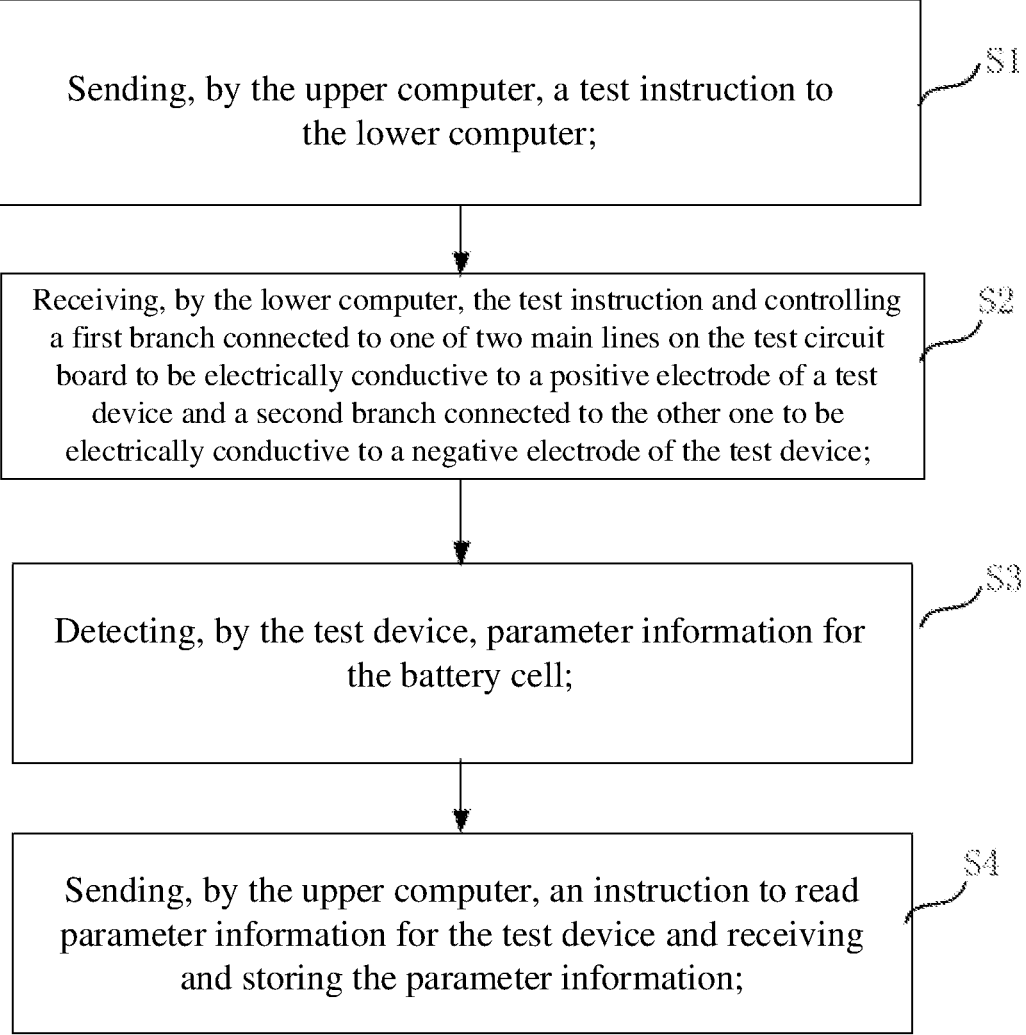
FIG. 4 is a flowchart of a first embodiment of a test method for a test system of the present application.

Please refer to FIG. 4, the present application further proposes a test method for a test system, wherein the test system comprises a test circuit board, a test device, an upper computer, and a lower computer, the test method comprising the following steps:

step S1: sending, by the upper computer, a test instruction to the lower computer;

step S2: receiving, by the lower computer, the test instruction and controlling a first branch connected to one of two main lines on the test circuit board to be electrically conductive to a positive electrode of a test device and a second branch connected to the other one to be electrically conductive to a negative electrode of the test device;

step S3: detecting, by the test device, parameter information for the battery cell; and step S4: sending, by the upper computer, an instruction to read parameter information for the test device and receiving and storing the parameter information.

In the above method, in step S1, before the upper computer sends the test instruction to the lower computer, the test system can be turned on by manually triggering the start-up member. In step 2, the lower computer, after receiving the test instruction, may control the control switches on the first branch and the second branch one by one, so as to make one main line conductive to the positive electrode of the test device and the other main line conductive to the negative electrode of the test device, and test one by one the parameter information for the battery cells that need to be tested until the testing of all the battery cells that need to be tested is completed. The above two main lines 111 may be selected to be two adjacent ones, or the corresponding two main lines 111 may also be selected according to the definition of the connector pins on the wire harness board of the battery module. The test device here can be a multimeter, a voltmeter or an oscilloscope, etc. The parameter information here can be voltage data or resistance data, etc., which can be selected according to the needs. In step S3, the test device may acquire the parameter information for the battery cell while the test circuit is conductive, and may store the parameter information or send it directly to the upper computer. In step S4, when the upper computer sends the instruction to read the parameter information, the test device then sends the parameter information to the upper computer, and the upper computer stores it after receiving it and, at the same time, can analyze it in order to determine whether the detection wire harness of the battery cell is on or off.

This method is that the upper computer sends a test instruction to the lower computer, and the lower computer can control the control switch that needs to be conducted, so that the first branch of one of the main lines is electrically conductive to the positive electrode of the test device, and the second branch of another main line is electrically conductive to the negative electrode of the test device, so as to enable the test device to detect the parameter information, e.g., the voltage information, for the battery cells in the battery module. By analogy, it is then possible to realize the sequential detection of the parameter information for the battery cells that need to be tested. The method for the test system in the present application can realize the sequential detection of multiple battery cells in a battery module without the need for repeated plugging and unplugging of wires by manual labor, which improves the detection efficiency and enhances the detection precision.

Please refer to FIG. 5, in an embodiment of the present application, the test device comprises a multimeter, the multimeter having a voltage mode and a resistance mode and being electrically connected to the lower computer, and the parameter information is voltage data; and after the step of sending, by the upper computer, an instruction to read parameter information for the test device and receiving and storing the parameter information, the test method comprises:

step S5: sending, by the lower computer, a mode switching instruction to the multimeter;

step S6: switching the multimeter to the resistance mode;

step S7: controlling, by the lower computer, a first branch connected to one of two main lines on the test circuit board to be electrically conductive to the positive electrode of the test device and a second branch connected to the other one to be electrically conductive to the negative electrode of the test device, so as to cause the multimeter to obtain resistance data; and step S8: sending, by the upper computer, an instruction to read the resistance data of the multimeter and receiving and storing the resistance data.

In the above method, in step S5, sending the switching mode to the multimeter by the lower computer can make the signal transmission faster, thereby enhancing the control efficiency to enable a higher switching efficiency of the multimeter. In other examples, it is also possible that the upper computer is communicatively connected directly to the multimeter and sends a mode switching instruction to the multimeter. After the multimeter switches to the resistance mode, as with the testing of the voltage data, the lower computer controls the control switches corresponding to the two main lines to be closed and thus conductive with the multimeter so as to test the NTC resistance at multiple battery cells one by one until the detection of all the battery cells that need to be detected is completed. The above two main lines 111 may be selected to be two adjacent ones, or the corresponding two main lines 111 may also be selected according to the definition of the connector pins on the wire harness board of the battery module. The test device can acquire the resistance data of the battery cell while the test circuit is conductive, and can store the resistance data directly. When the upper computer sends the instruction to read the parameter information, the test device then sends the parameter information to the upper computer, and the upper computer stores it after receiving it and, at the same time, can analyze it in order to determine whether the detection wire harness of the battery cell is on or off. Alternatively, in other examples, the multimeter directly sends the resistance data to the upper computer while obtaining it.

The test method, through the use of a multimeter, can test one by one the voltage and the resistance and other values of single battery cells within the battery module, and then calculate and obtain the voltage difference as well as the temperature and other values corresponding to the resistance, and then, according to the above results, can determine whether the sampling wire harness within the battery module is on or off, thereby enhancing the precision of the detection. In this method, the detection of two values can be realized by a multimeter without the need for repeated plugging and unplugging of the wire harness, which can further enhance the detection efficiency and protect the wire harness and the plug connector, thus improving the usability.

Figure 6:
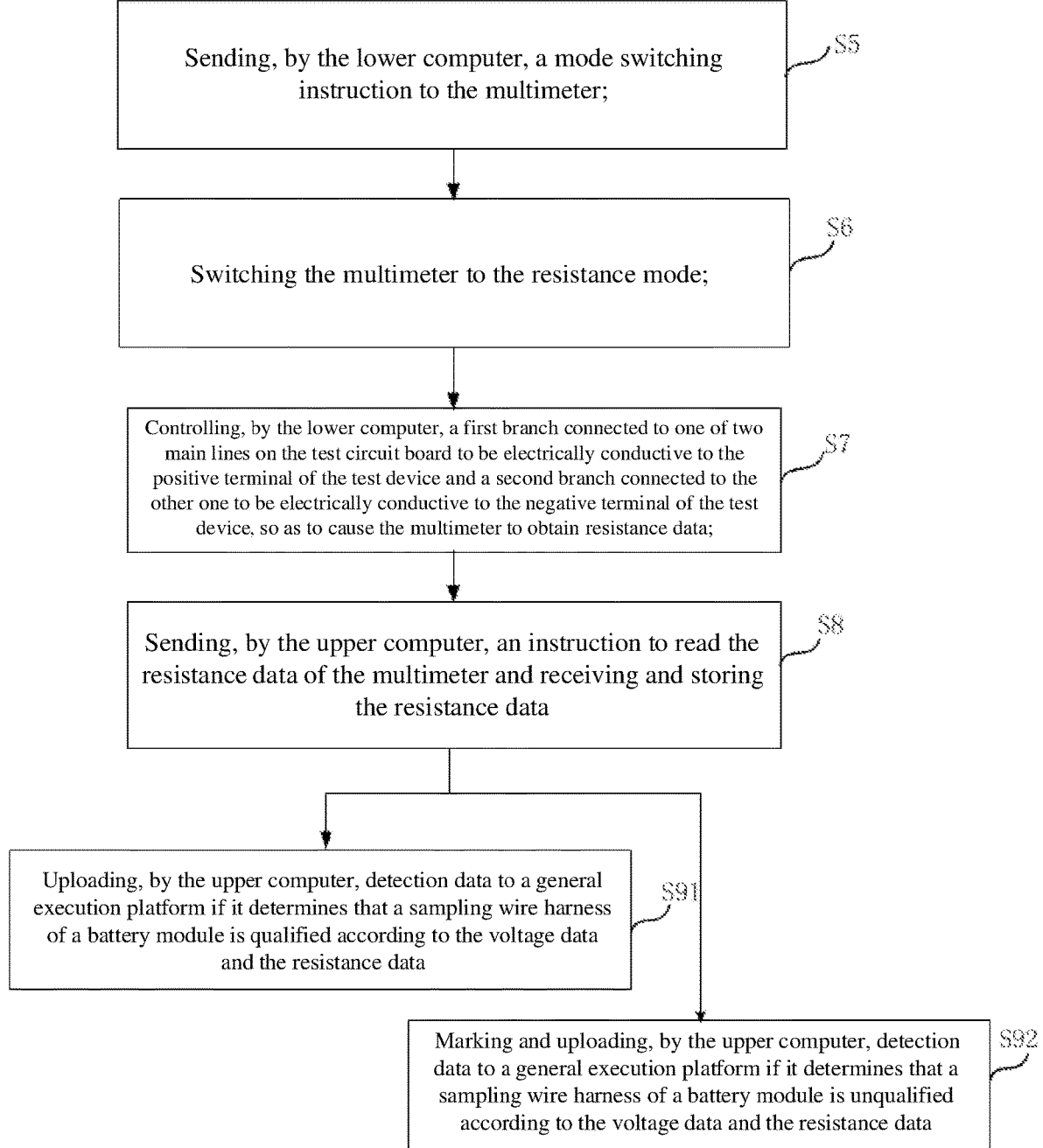
FIG. 6 is a flowchart of a third embodiment of a test method for a test system of the present application.

Please refer to FIG. 6, in an embodiment of the present application, after the step of sending, by the upper computer, an instruction to read the resistance data of the multimeter and receiving and storing the resistance data, the test method further comprises:

step S91: uploading, by the upper computer, detection data to a general execution platform if it determines that a sampling wire harness of a battery module is qualified according to the voltage data and the resistance data;

or step S92: marking and uploading, by the upper computer, detection data to a general execution platform if it determines that a sampling wire harness of a battery module is unqualified according to the voltage data and the resistance data.

In step S91, the upper computer can calculate the voltage difference of a single battery cell according to the voltage data, and can obtain the temperature value corresponding to the NTC resistance according to the resistance data, and compare the actual voltage difference and temperature value detected with the standard voltage difference and temperature value, and if they are the same, it can determine that the sampling wire harness at a certain position of the battery module is qualified, and store data such as the voltage, voltage difference, NTC temperature, etc., of the single battery cell locally, and at the same time upload them directly to the general execution platform.

In step S92, the basis of judgment is the same as that described above, and if the comparison results obtained are inconsistent, it is indicated that the sampling wire harness is faulty or disconnected at that position, and at this time, it is necessary to mark the obtained data before uploading it to the general execution platform.

In this method, through the processing by the upper computer, the detection of the sampling wire harness of the battery module can be realized in order to quickly find the defects of the battery module so as to avoid reworking, and at the same time, the differentiation of different test results can be realized, so as to provide traceable data for the subsequent processing.

Figure 7:
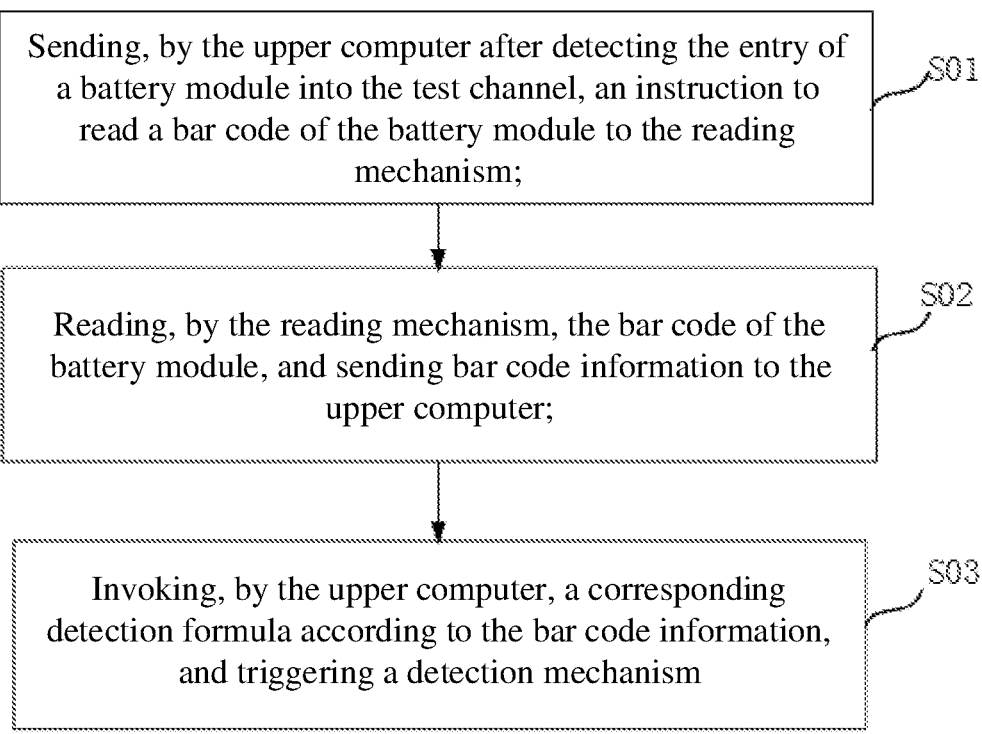
FIG. 7 is a flowchart of a fourth embodiment of a test method for a test system of the present application.

Please refer to FIG. 7, in an embodiment of the present application, the test system further comprises a test frame body and a reading mechanism, the test frame body being formed with a test channel; and before the step S1 of sending, by the upper computer, a
test instruction to the lower computer, the test method
further comprises the following steps:

step S01: sending, by the upper computer after detecting
the entry of a battery module into the test channel, an
instruction to read a bar code of the battery module to
the reading mechanism;

step S02: reading, by the reading mechanism, the bar code
of the battery module, and sending bar code informa-
tion to the upper computer; and step S03: invoking, by the upper computer, a correspond-
ing detection formula according to the bar code infor-
mation, and triggering a detection mechanism.

The test frame body can provide a detection environment
for the battery module to prevent external interference, thus
effectively improving the protective properties, and facilitate
the assembly and fixing of various components, for example,
the reading mechanism, to provide support and adapt to the
production line, thus improving the overall detection effi-
ciency of the battery module.

The reading mechanism may be a radio frequency auto-
matic identification apparatus or a bar code scanner, which
is not limited herein. Because of the differences in the
structure and type of the battery module, the reading mecha-
nism is provided to read the bar code information for the
battery module, so as to acquire the type or structure
corresponding to the battery module, which facilitates the
selection of the corresponding test scheme by the upper
computer according to the acquired type or structure of the
battery module. Therefore, before the upper computer sends
the test instruction, in step S01, a detection is first performed
in the test channel to determine whether or not there is a
battery module that needs to be detected entering, and if
there is, the bar code information needs to be read first. In
step S02, after reading the bar code, the reading mechanism
sends the obtained bar code information to the upper com-
puter. Then, in step S03, the upper computer invokes the
corresponding test scheme and test mechanism based on the
bar code information, thereby making the control of the
lower computer more targeted and accurate.

The test scheme is to first edit the test sequence, the
multimeter measurement mode (voltage mode or resistance
mode), and the serial number of the relay to be closed in the
software of the upper computer in accordance with the test
requirements of the battery cell (the requirements are gen-
erally battery cell voltage test, battery cell voltage differ-
ence, and NTC resistance test) as well as the definition of the
connector pins. By the provision of the reading mechanism,
more targeted detection can be carried out according to
different types of battery modules, thus improving the appli-
cability and detection precision.

Figure 8:
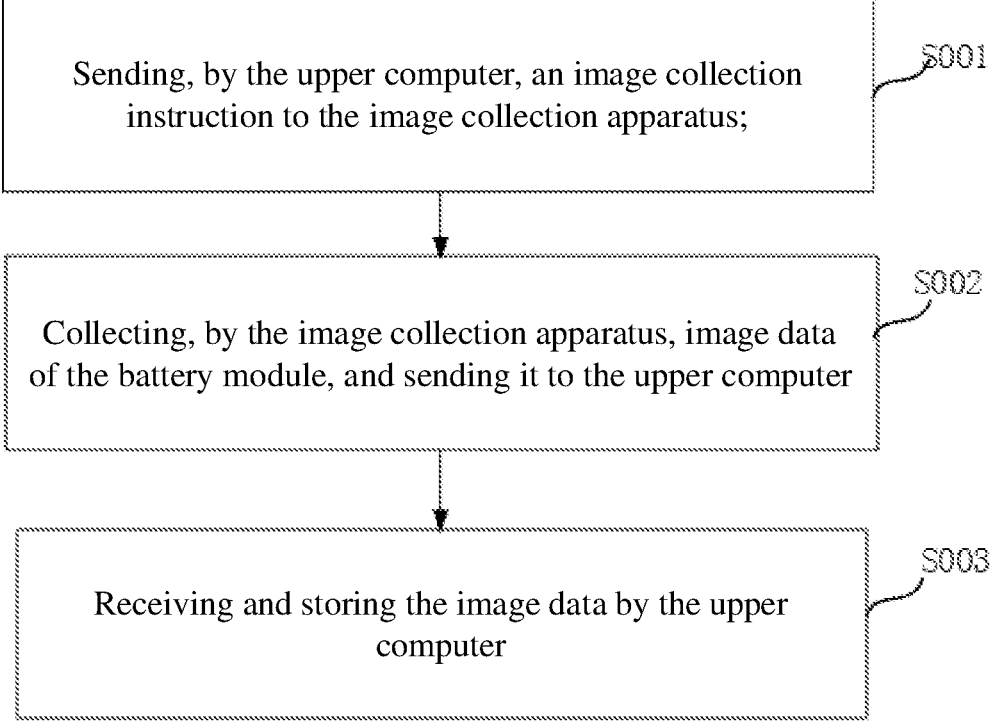
FIG. 8 is a flowchart of a fifth embodiment of a test method for a test system of the present application.

Please refer to FIG. 8, in an embodiment of the present
application, the detection system further comprises an image
collection apparatus, and before the step S01 of sending, by
the upper computer after detecting the entry of a battery
module into the test channel, an instruction to read a bar
code of the battery module to the reading mechanism, the
test method further comprises:

step S001: sending, by the upper computer, an image
collection instruction to the image collection apparatus;

step S002: collecting, by the image collection apparatus,
image data of the battery module, and sending it to the
upper computer; and step S003: receiving and storing the image data by the
upper computer.

The type of image collection apparatus is not limited and
may be a line scan camera or an area camera, a 3d camera, or the like. The image collection apparatus can collect the
overall condition of the battery module and the connection
condition of the battery cells to obtain image data and send
same to the upper computer; and the upper computer stores
same, so as to provide a retrospective basis for subsequent
performance analysis.

In other examples, it is also possible to perform the
reading of the bar code information for the battery module
first and then perform the collection of the image data.

Figure 9:
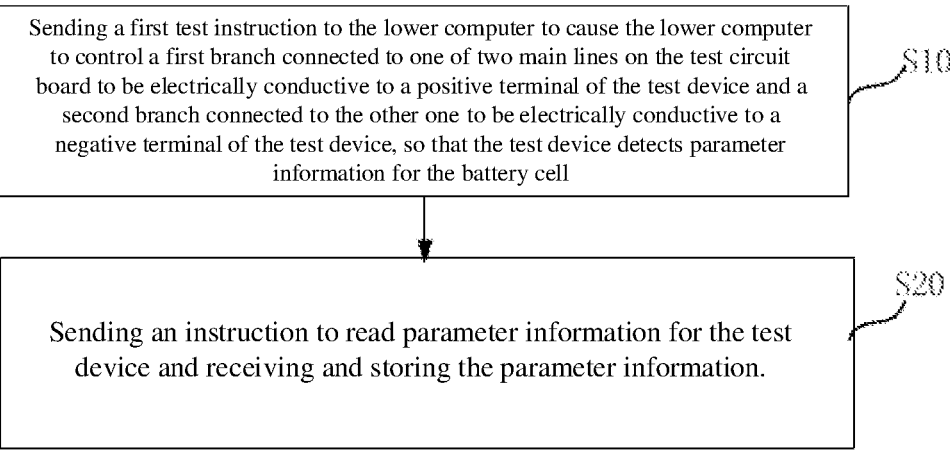
FIG. 9 is a flowchart of a sixth embodiment of a test method for a test system of the present application.

Please refer to FIG. 9, the present application further
proposes a test method for a test system, wherein the test
system comprises a test circuit board, a test device, an upper
computer, and a lower computer, the test method comprising
the following steps:

step S10: sending a first test instruction to the lower
computer to cause the lower computer to control a first
branch connected to one of two main lines on the test
circuit board to be electrically conductive to a positive
electrode of the test device and a second branch con-
nected to the other one to be electrically conductive to
a negative electrode of the test device, so that the test
device detects parameter information for the battery
cell; and step S20: sending an instruction to read parameter infor-
mation for the test device and receiving and storing the
parameter information.

In step S10 of the test method, this method is that the
upper computer sends a first test instruction to the lower
computer, and the lower computer can control the control
switch that needs to be conducted, so that the first branch of
one of the main lines is electrically conductive to the
positive electrode of the test device, and the second branch
of another main line is electrically conductive to the nega-
tive electrode of the test device, so as to enable the test
device to detect the parameter information for the battery
cells in the battery module. The above two main lines 111
may be selected to be two adjacent ones, or the correspond-
ing two main lines 111 may also be selected according to the
definition of the connector pins on the wire harness board of
the battery module. By analogy, the sequential detection of
parameter information for multiple battery cells can be
realized. The parameter information may be voltage data,
and may also be resistance data or other parameters, and so
on, and the test device is correspondingly selected according
to the test of the parameter information, e.g., a multimeter,
a voltmeter or an oscilloscope, or the like. In step S20, the
upper computer acquires the parameter information, and
stores it, and analyzes and processes it at the same time so
as to determine the on-off condition of the sampling wire
harness of the battery module.

The method for the test system in the present application
can realize the sequential detection of multiple battery cells
in a battery module without the need for repeated plugging
and unplugging of wires by manual labor, which improves
the detection efficiency and enhances the detection preci-
sion.

Figure 10:
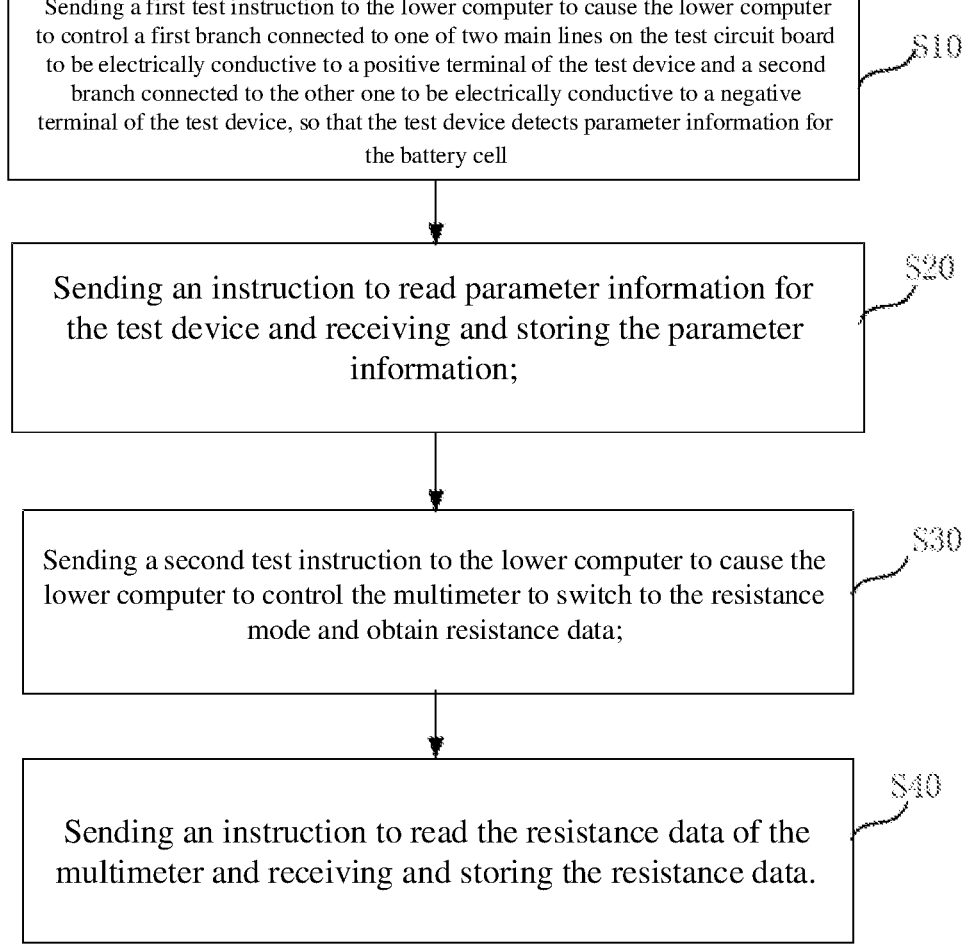
FIG. 10 is a flowchart of a seventh embodiment of a test method for a test system of the present application.

Please refer to FIG. 10, in an embodiment of the present
application, the test device comprises a multimeter, the
multimeter having a voltage mode and a resistance mode
and being electrically connected to the lower computer, and
the parameter information is voltage data; and after the step
S20 of sending an instruction to read parameter information
for the test device and receiving and storing the parameter
information, the test method further comprises:

step S30: sending a second test instruction to the lower computer to cause the lower computer to control the multimeter to switch to the resistance mode and obtain resistance data; and step S40: sending an instruction to read the resistance data of the multimeter and receiving and storing the resistance data.

Sending the switching mode to the multimeter by the lower computer can make the signal transmission faster, thereby enhancing the control efficiency to enable a higher switching efficiency of the multimeter. In other examples, it is also possible that the upper computer is communicatively connected directly to the multimeter and sends a mode switching instruction to the multimeter. The multimeter is first in the voltage mode, and after completing the detection of the voltage data of the battery cell, it receives the switching instruction and switches to the resistance mode, and then as with the testing of the voltage data, the lower computer controls the control switches corresponding to the two main lines to be closed and thus conductive with the multimeter so as to test multiple NTC resistance one by one until the detection of all the battery cells that need to be detected is completed. The test device can acquire the resistance data of the battery cell while the test circuit is conductive, and can store the resistance data directly. When the upper computer sends the instruction to read the parameter information, the test device then sends the parameter information to the upper computer, and the upper computer stores it after receiving it and, at the same time, can analyze it in order to determine whether the detection wire harness of the battery cell is on or off. Alternatively, in other examples, the multimeter directly sends the resistance data to the upper computer while obtaining it.

The test method, through the use of a multimeter, can test one by one the voltages and the NTC resistance and other values of battery cells within the battery module that need to be tested, and then, according to the results of the detection, can determine whether the sampling wire harness within the battery module is on or off. In this method, the detection of two values can be realized by a multimeter without the need for repeated plugging and unplugging of the wire harness, which simplifies the structure, and can further enhance the detection efficiency and protect the wire harness and the plug connector, thus improving the usability.

In an embodiment of the present application, after the step S40 of sending an instruction to read the resistance data of the multimeter and receiving and storing the resistance data, the test method further comprises:

step S510: uploading detection data to a general execution platform if it is determined that a sampling wire harness of a battery module is qualified according to the voltage data and the resistance data;

or step S520: marking and uploading detection data to a general execution platform if it is determined that a sampling wire harness of a battery module is unqualified according to the voltage data and the resistance data.

In step S510, the upper computer can calculate the voltage difference of a battery cell according to the voltage data, and can obtain the temperature value corresponding to the NTC resistance according to the resistance data, and compare the actual voltage difference and temperature value detected with the standard voltage difference and temperature value, and if they are the same, it can determine that the sampling wire harness at a certain position of the battery module is qualified, and store data such as the voltage, voltage difference, NTC temperature, etc., of the single battery cell locally, and at the same time upload them directly to the general execution platform.

In step S520, the basis of judgment is the same as that described above, and if the comparison results obtained are inconsistent, it is indicated that the sampling wire harness is faulty or disconnected at that position, and at this time, it is necessary to mark the obtained data before uploading it to the general execution platform.

In this method, through the processing by the upper computer, the detection of the wire harness of the battery module can be realized, so as to quickly find the defects of the battery module to avoid reworking, and at the same time, the differentiation of different test results can be realized, so as to provide traceable data for the subsequent processing.

Figure 11:
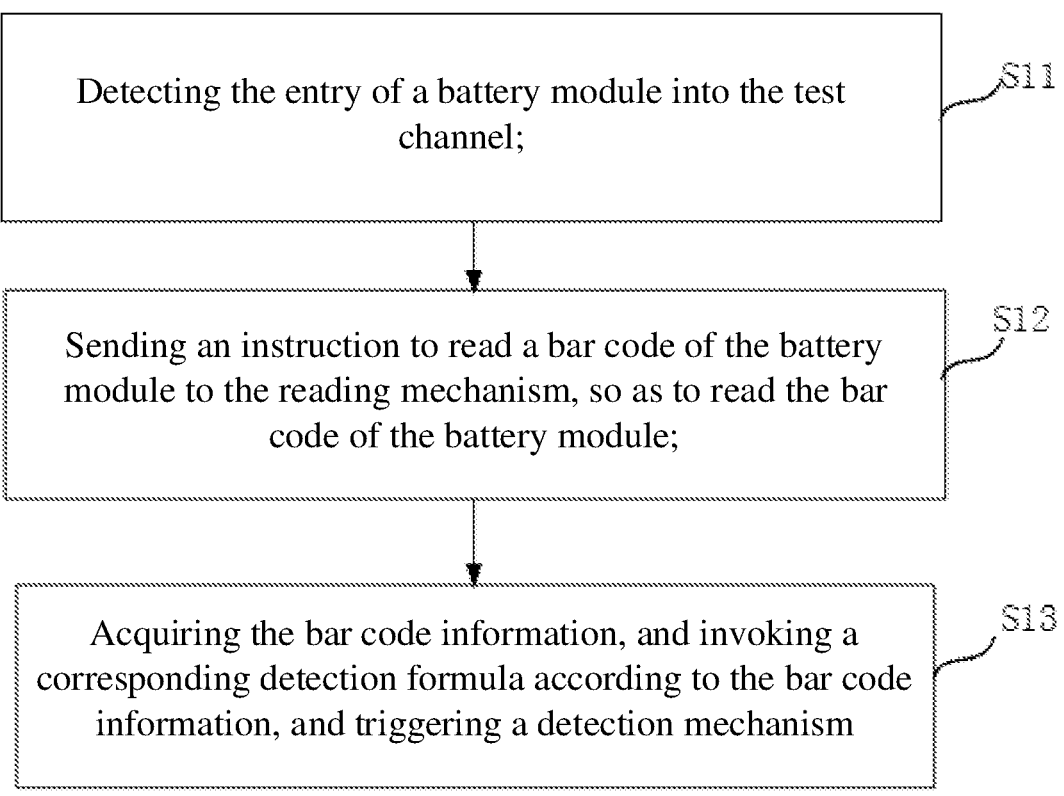
FIG. 11 is a flowchart of an eighth embodiment of a test method for a test system of the present application.

Please refer to FIG. 11, in an embodiment of the present application, the test system further comprises a test frame body and a reading mechanism, the test frame body being formed with a test channel, and before the step of sending a first test instruction to the lower computer, the test method further comprises the following steps:

step S11: detecting the entry of a battery module into the test channel;

step S12: sending an instruction to read a bar code of the battery module to the reading mechanism, so as to read the bar code of the battery module; and step S13: acquiring the bar code information, and invoking a corresponding detection formula according to the bar code information, and triggering a detection mechanism.

The test frame body can provide a detection environment for the battery module to prevent external interference, thus effectively improving the protective properties, and facilitate the assembly and fixing of various components, for example, the reading mechanism, to provide support and adapt to the production line, thus improving the overall detection efficiency of the battery module.

The reading mechanism may be a radio frequency automatic identification apparatus or a bar code scanner, which is not limited herein. Because of the differences in the structure and type of the battery module, the reading mechanism is provided to read the bar code information for the battery module, so as to acquire the type or structure corresponding to the battery module, which facilitates the selection of the corresponding test scheme by the upper computer according to the acquired type or structure of the battery module. Therefore, before the upper computer sends the test instruction, in step S01, a detection is first performed in the test channel to determine whether or not there is a battery module that needs to be detected entering, and if there is, the bar code information needs to be read first. In step S02, after reading the bar code, the reading mechanism sends the obtained bar code information to the upper computer. Then, in step S03, the upper computer invokes the corresponding test scheme and test mechanism based on the bar code information, thereby making the control of the lower computer more targeted and accurate.

By the provision of the reading mechanism, more targeted detection can be carried out according to different types of battery modules, thus improving the applicability and detection precision.

Figure 12:
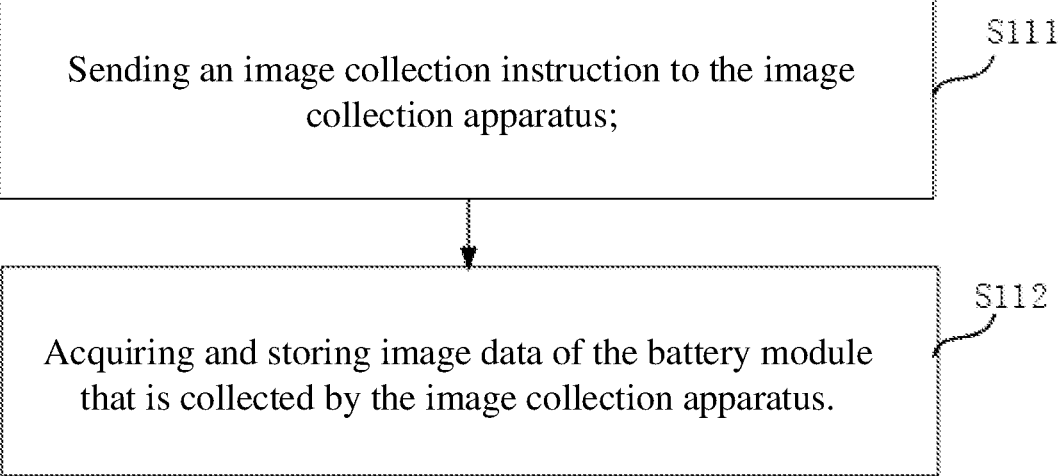
FIG. 12 is a flowchart of a ninth embodiment of a test method for a test system of the present application.

Please refer to FIG. 12, in an embodiment of the present application, the detection system further comprises an image collection apparatus, and after the step of detecting the entry of a battery module into the test channel and before the step of sending an instruction to read a bar code of the battery module to the reading mechanism, so as to read the bar code of the battery module, the test method further comprises:

step S111: sending an image collection instruction to the image collection apparatus; and step S112: acquiring and storing image data of the battery module that is collected by the image collection apparatus.

Here, the image collection apparatus can collect the overall condition of the battery module and the connection condition of the battery cells and store same, so as to provide a retrospective basis for subsequent performance analysis.

The type of image collection apparatus is not limited and may be a line scan camera or an area camera, a 3d camera, or the like. The image collection apparatus can collect the overall condition of the battery module and the connection condition of the battery cells to obtain image data and send same to the upper computer; and the upper computer stores same, so as to provide a retrospective basis for subsequent performance analysis.

In other examples, it is also possible to perform the reading of the bar code information for the battery module first and then perform the collection of the image data.

An Embodiment of the Test Process of a Test System

The upper computer of the test system, after detecting a coming battery module, reads the bar code information for the battery module on the pallet by RFID and sends it to the upper computer. The upper computer automatically invokes a test formula according to the bar code information and sends the test instruction to the lower computer.

The lower computer controls the on-off of the test circuit of the test circuit board and, according to the requirements of the test formula, connects the 64Pin aviation plug that is connected to the battery module and is provided with a change-over test wire harness to the positive and negative pens of the multimeter. Specifically, the upper computer notifies the lower computer that the voltage of the first battery cell is to be tested and sends to the lower computer the control switches (i.e., contacts K1 and K22) that need to be closed, and then the lower computer closes the K1 and K22 and obtains the voltage of the first battery cell, and then conducts the tests one by one in sequence, thereby obtaining the voltage data of the multiple battery cells. Then, the upper computer communicates with the multimeter to switch the high-precision multimeter to the voltage and resistance modes as well as ranges, or the lower computer communicates with the multimeter to realize the control of switching of modes and ranges, and in this way, the multimeter obtains the resistance data of the multiple battery cells in sequence.

The upper computer sends an instruction to read the voltage data and the resistance data of the digital multimeter, and calculates the voltage difference of a single battery cell and the temperature corresponding to the NTC resistance, and stores data such as the voltage the voltage difference and the NTC temperature of the single battery cell in a specified format in the local hard disk, and uploads them to a data tracing system at the same time.

The test system of the present application is an automatic test device that can be used for on-off test of the wire harness sampling plate of the battery module, and has the advantages of high compatibility, traceability, high testing efficiency, high stability, and low cost.

Another embodiment of the test process of the test system:

When there is an incoming battery module, the jacking mechanism lifts the battery module out of the doubling chain. The image collection apparatus takes a picture and saves it, and the operator installs the change-over test wire harness and presses the start-up member.

The RFID reads the bar code of the battery module, the lower computer acquires the bar code and sends it to the upper computer, and the upper computer automatically invokes the test formula according to the bar code information, and carries out the test according to the content of the test formula. After the test is completed, the operator unplugs the change-over test wire harness and returns it to its place, and presses the release button. The battery module flows out of the test system.

The first test formula: the test device is controlled by the upper computer.

1. The upper computer issues instructions for all test items at one time to the lower computer according to the contents of the formula;

2. the upper computer switches the mode and range of the multimeter according to the test item and sends an instruction to the lower computer synchronously;

3. the lower computer closes the corresponding control switch according to the content of the instruction for the first test item and informs the upper computer that the closing action has been completed; and 4. the upper computer reads and saves the result of this test item.

The remaining test items are tested one by one in the order of steps 2-3-4.

The second test formula: the test device is controlled by the lower computer.

1. The upper computer issues instructions for all test items at one time to the lower computer according to the contents of the formula;

2. the upper computer notifies the PLC that the nth test is to be started;

3. the lower computer controls the multimeter to be switched to the corresponding mode (voltage/resistance) in accordance with the content of the instruction for the test item, and synchronously closes the control switch of the corresponding test circuit;

4. after the control switch is closed, the lower computer reads the test data from the multimeter and saves it to the data block specified for the test item; and 5. the upper computer finds that there is data in the data block corresponding to this test item through comparison, and acquires the data and saves and displays it in the software interface.

The remaining test items are tested one by one in the order of steps 2-3-4-5.

Embodiments described above are only some of the embodiments of the present application, and are not intended to limit the patent scope of the present application, and any equivalent structural transformations made under the inventive concept of the present application using the contents of the specification of the present application and the accompanying drawings, or directly/indirectly utilized in other related fields of technology are included in the patent protection scope of the present application.

What is claimed is:

1. A test system for testing a wire harness on-off condition of a battery module, the battery module comprising multiple battery cells connected in series and parallel, wherein the test system comprises:

a test circuit board provided with a test circuit, the test circuit comprising multiple main lines arranged side by side, one end of each of the main lines being used to connect with a positive electrode or a negative electrode of each battery cell of the battery module, and the other end of each of the main lines being connected with a first branch and a second branch, wherein each said first branch is provided with one control switch, and each said second branch is provided with one said control switch;

a test device for testing parameter information for the multiple battery cells of the battery module;

a lower computer electrically connected to the control switch to control a first branch connected to one of the main lines to be electrically conductive to a positive electrode of the test device and a second branch connected to another one of the main lines to be electrically conductive to a negative electrode of the test device; and an upper computer communicatively connected to both the test device and the lower computer to control the operation of the lower computer and read parameter information for the test device;

wherein ends of the multiple first branches that are not connected to the main lines are connected to form a first connecting end, ends of the multiple second branches that are not connected to the main lines are connected to form a second connecting end, one of the first connecting end and the second connecting end is electrically connected to the positive electrode of the test device, and the other one is electrically connected to the negative electrode of the test device; and wherein:

the first connecting end is provided in a number of at least two, the at least two first connecting ends being provided in parallel; and/or the second connecting end is provided in a number of at least two, the at least two second connecting ends being provided in parallel.

2. The test system of claim 1, wherein the test circuit further comprises multiple fuses, each of the fuses being provided on one of the main lines.

3. The test system of claim 1, wherein the test device is a multimeter, the multimeter comprising a voltage mode and a resistance mode, and the multimeter being electrically connected to the upper computer or the lower computer to switch between the voltage mode and the resistance mode.

4. The test system of claim 1, further comprising a change-over test wire harness, one end of each of the multiple main lines being connected with an aviation plug, two ends of the change-over test wire harness being plugged into the aviation plug and a plug-in end of the battery module, respectively.

5. The test system of claim 4, further comprising a reading mechanism, the reading mechanism being electrically connected to the upper computer, the reading mechanism being used to read bar code information for the battery module and send the bar code information to the upper computer, and the upper computer invoking a test scheme according to the bar code information.

6. The test system of claim 5, further comprising a test frame body, the test frame body comprising multiple transverse beams and multiple vertical beams that are connected longitudinally and transversely, wherein a test channel is formed through enclosure by the multiple transverse beams and the vertical beams, the test channel is configured for the battery module to pass through, and the reading mechanism is provided in the test channel.

7. The test system of claim 6, further comprising an image collection apparatus, the image collection apparatus being provided at one of the transverse beams and electrically connected to the upper computer to take a photograph of a battery module in the test channel for sampling and send the photograph of the battery module to the upper computer.

8. The test system of claim 7, further comprising:

a light source, the light source being provided at another one of the transverse beams and located at one side of the image collection apparatus; and/or a safety light curtain, the safety light curtain being provided between two vertical beams oppositely arranged, and being electrically connected to the upper computer to block the test channel.

9. The test system of claim 6, further comprising an integrated cabinet, the integrated cabinet being formed with an accommodating cavity and located at one side of the test frame body, the test circuit board, the test device, and the lower computer being all provided in the accommodating cavity, and the aviation plug being at least partially exposed in the integrated cabinet.

10. The test system of claim 9, further comprising a warning member, the warning member being mounted to the test frame body and/or the integrated cabinet and electrically connected to the upper computer to reflect the operational status of the test system.

11. The test system of claim 6, further comprising a human-computer interaction apparatus, the human-computer interaction apparatus being mounted to the test frame body and electrically connected to the upper computer to display detection information or to debug the test system.

12. The test system of claim 11, wherein a mounting bracket is rotatably connected to one of the vertical beams, and the human-computer interaction apparatus is mounted to the mounting bracket so as to be rotatably provided on a horizontal plane relative to the test frame body.

13. The test system of claim 6, further comprising an accommodating member, the accommodating member being provided on one of the transverse beams or vertical beams to accommodate the change-over test wire harness.

14. The test system of claim 6, further comprising:

a start-up member, the start-up member being provided at a circumferential side of the test frame body and the start-up member being provided with two start-up portions, with the two start-up portions being electrically connected to the upper computer to start the test system; and/or a card reader, the card reader being mounted on the test frame body and electrically connected to the upper computer.

15. A test method for the test system according to claim 1, comprising:

sending, by the upper computer, a test instruction to the lower computer;

receiving, by the lower computer, the test instruction and controlling the first branch connected to one of the main lines on the test circuit board to be electrically conductive to the positive electrode of the test device and the second branch connected to another one of the main lines to be electrically conductive to the negative electrode of the test device;

detecting, by the test device, the parameter information for the battery cell; and sending, by the upper computer, an instruction to read the parameter information for the test device and receiving and storing the parameter information.

16. The test method of claim 15, wherein the test device comprises a multimeter, the multimeter having a voltage mode and a resistance mode and being electrically connected to the lower computer, and the parameter information is voltage data; and after the step of sending, by the upper computer, an instruction to read the parameter information for the test device and receiving and storing the parameter information, the test method comprises:

sending, by the lower computer, a mode switching instruction to the multimeter;

switching the multimeter to the resistance mode;

controlling, by the lower computer, a first branch connected to one of two main lines on the test circuit board to be electrically conductive to the positive electrode of the test device and a second branch connected to the other one of the two main lines to be electrically conductive to the negative electrode of the test device, so as to cause the multimeter to obtain resistance data; and sending, by the upper computer, an instruction to read the resistance data of the multimeter and receiving and storing the resistance data.

17. The test method of claim 16, wherein after the step of sending, by the upper computer, an instruction to read the resistance data of the multimeter and receiving and storing the resistance data, the test method further comprises:

uploading, by the upper computer, detection data to a general execution platform if it determines that a sampling wire harness of a battery module is qualified according to the voltage data and the resistance data; or marking and uploading, by the upper computer, detection data to a general execution platform if it determines that a sampling wire harness of a battery module is unqualified according to the voltage data and the resistance data.

18. The test method of claim 15, further comprises a test frame body and a reading mechanism, the test frame body being formed with a test channel; and before the step of sending, by the upper computer, a test instruction to the lower computer, the test method further comprises the steps of:

sending, by the upper computer after detecting the entry of a battery module into the test channel, an instruction to read a bar code of the battery module to the reading mechanism;

reading, by the reading mechanism, the bar code of the battery module, and sending bar code information to the upper computer; and invoking, by the upper computer automatically, a corresponding detection formula according to the bar code information, and triggering a detection mechanism.

19. A test system for testing a wire harness on-off condition of a battery module, the battery module comprising multiple battery cells connected in series and parallel, wherein the test system comprises:

a test circuit board provided with a test circuit, the test circuit comprising multiple main lines arranged side by side, one end of each of the main lines being used to connect with a positive electrode or a negative electrode of each battery cell of the battery module, and the other end of each of the main lines being connected with a first branch and a second branch, wherein each said first branch is provided with one control switch, and each said second branch is provided with one said control switch, and wherein the multiple main lines each have one end connected with an aviation plug;

a test device for testing parameter information for the multiple battery cells of the battery module;

a lower computer electrically connected to the control switch to control a first branch connected to one of the main lines to be electrically conductive to a positive electrode of the test device and a second branch connected to another one of the main lines to be electrically conductive to a negative electrode of the test device;

an upper computer communicatively connected to both the test device and the lower computer to control the operation of the lower computer and read parameter information for the test device;

a test frame body, the test frame body comprising multiple transverse beams and multiple vertical beams that are connected longitudinally and transversely; and an integrated cabinet, the integrated cabinet being formed with an accommodating cavity and located at one side of the test frame body, the test circuit board, the test device, and the lower computer being all provided in the accommodating cavity, and the aviation plug being at least partially exposed in the integrated cabinet.

* * * * *